(12) United States Patent
Sasagawa

(10) Patent No.: US 6,879,925 B1
(45) Date of Patent: Apr. 12, 2005

(54) METAL INTERCONNECT RELIABILITY EVALUATION DEVICE, METHOD THEREOF, AND RECORDING MEDIUM STORING PROGRAM FOR EVALUATING RELIABILITY OF METAL INTERCONNECT

(75) Inventor: Kazuhiko Sasagawa, Saitama (JP)

(73) Assignee: Japan Science and Technology Corporation, Saitama (JP)

( * ) Notice: Subject to any disclaimer, the term of this patent is extended or adjusted under 35 U.S.C. 154(b) by 0 days.

(21) Appl. No.: 09/959,073

(22) PCT Filed: Jul. 28, 1999

(86) PCT No.: PCT/JP99/04084
§ 371 (c)(1),
(2), (4) Date: Jan. 18, 2002

(87) PCT Pub. No.: WO00/63962
PCT Pub. Date: Oct. 26, 2000

(30) Foreign Application Priority Data

Apr. 19, 1999 (JP) .......................................... 11-111478

(51) Int. Cl.[7] .............................................. G06F 17/50
(52) U.S. Cl. ........................ 702/123; 324/537; 324/763
(58) Field of Search ........................... 702/123; 29/846, 29/830; 174/126.3, 126.4, 250, 255, 257, 258, 261; 361/779; 257/E21.5; 324/537, 763, 158.1; 716/2, 5; 428/209

(56) References Cited

U.S. PATENT DOCUMENTS

| | | | | | |
|---|---|---|---|---|---|
| 5,382,831 | A | * | 1/1995 | Atakov et al. ............... | 257/767 |
| 5,439,731 | A | * | 8/1995 | Li et al. ...................... | 428/209 |
| 5,497,076 | A | * | 3/1996 | Kuo et al. ................ | 324/158.1 |
| 5,563,517 | A | * | 10/1996 | Biery et al. .................. | 324/613 |
| 5,581,475 | A | * | 12/1996 | Majors ........................ | 716/10 |
| 5,760,595 | A | * | 6/1998 | Edwards et al. ............. | 324/703 |
| 5,822,218 | A | * | 10/1998 | Moosa et al. ................... | 716/4 |
| 6,038,383 | A | * | 3/2000 | Young et al. .................. | 716/5 |
| 6,320,391 | B1 | * | 11/2001 | Bui ............................ | 324/537 |
| 6,634,013 | B2 | * | 10/2003 | Shinzawa ...................... | 716/5 |
| 6,714,037 | B1 | * | 3/2004 | Hau-Riege et al. ......... | 324/766 |

FOREIGN PATENT DOCUMENTS

| | | | |
|---|---|---|---|
| JP | 07-283283 | 10/1995 | |
| JP | 07283283 A | * 10/1995 | ........... H01L/21/66 |

OTHER PUBLICATIONS

R. Kirchheim et al., "Atomistic and computer modeling of metallization failure of integrated circuits by electromigration", vol. 70, No. 1, pp. 172–181, Journal of Applied Physics (Jul./1991).

(Continued)

Primary Examiner—Carol S. W. Tsai
(74) Attorney, Agent, or Firm—Rader, Fishman & Grauer PLLC

(57) ABSTRACT

Estimation related to void formation and breakage/failure is performed through numerical simulation using dominant parameters of EM damage in a metal interconnect. The metal interconnect is divided into elements. Current density and temperature distribution is obtained using numerical analysis. Atomic flux divergence $AFD_{gen}$ of each element and the distribution thereof is calculated by using material property constants determined through acceleration testing. The reduction of volume per one calculation step in the simulation is found by multiplying the volume of each element, the length of time corresponding to one calculation step, and the atomic volume corresponding to the calculated $AFD_{gen}$. Based on the reduced amount of volume, the thickness of each element decreases. The elements having a decrease in thickness show the fact that voids have formed. The numerical analysis of the current density and temperature distribution in the metal interconnect is once again performed considering the thickness of each element.

6 Claims, 26 Drawing Sheets

OTHER PUBLICATIONS

Kazuhiko Sasagawa et al, "A new approach to calculate atomic flux divergence by electromigation", vol. 120, pp. 360–366, Journal of Applied Physics (Dec./1998).

Kazuhiko Sasagawa et al, "A new method to predict electromigration failure of metal lines", vol. 86, No. 11, pp. 1–9, Journal of Applied Physics (Dec./1999).

* cited by examiner

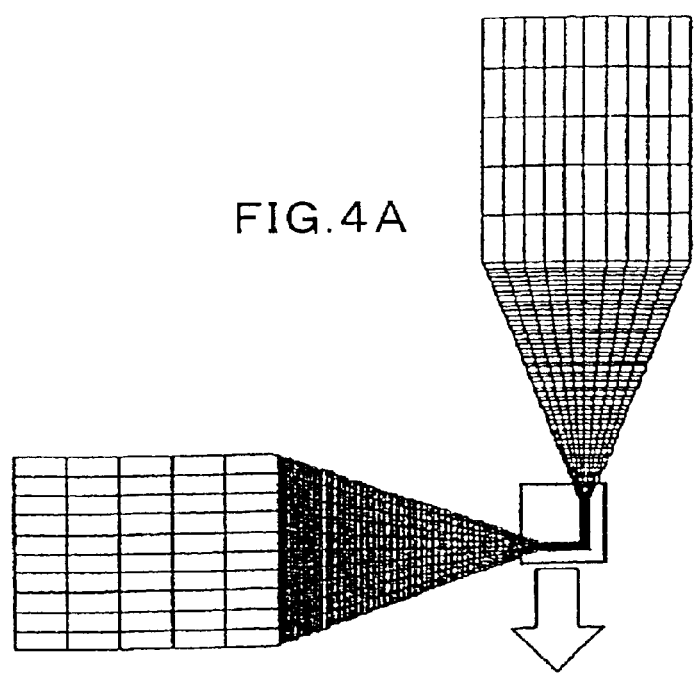
FIG.4A
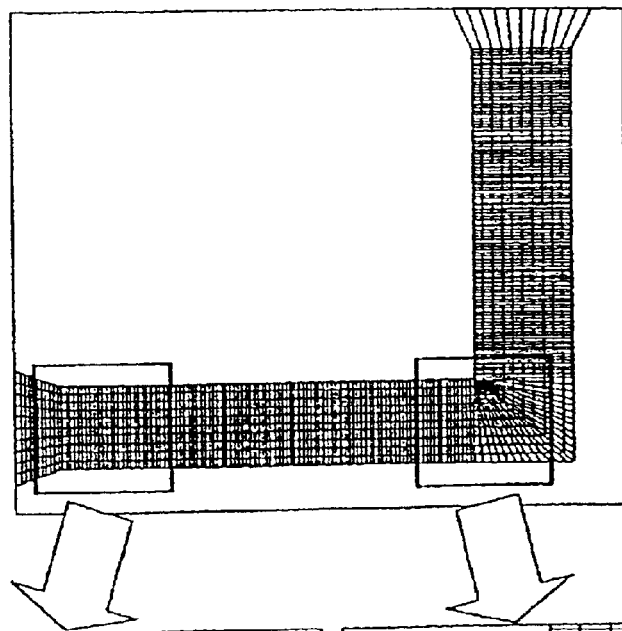
FIG.4B
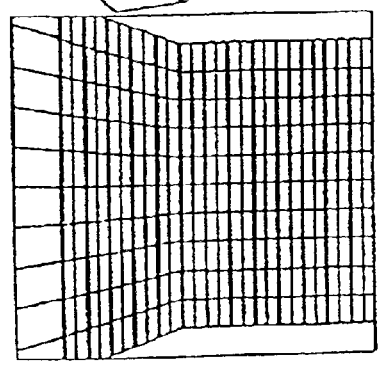 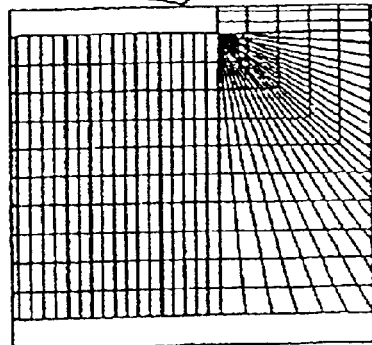
FIG.4C       FIG.4D

FIG.8C THICKNESS ISOGRAM [μm] — 0.1 ····0.3

ENLARGED VIEW

7700s

FIG.8B THICKNESS ISOGRAM [μm] ····0.3

6000s

FIG.8A THICKNESS ISOGRAM [μm] ····0.3

4000s

AVERAGE TIME TO FAILURE(TESTED) : 6731s [6820s]
LIFETIME(ESTIMATED) : 7700s

AVERAGE TIME TO FAILURE(TESTED) : 3655s [4095s]
LIFETIME(ESTIMATED) : 3400s

FIG.14

TABLE 1
CONSTANTS USED IN SIMULATION

| | SAMPLE 1 | SAMPLE 2 |
|---|---|---|
| $\rho_0\ [\Omega \cdot \mu m]$ | $4.45 \times 10^{-2}$ (373K) | $4.95 \times 10^{-2}$ (413K) |
| $\alpha\ [/K]$ | 0.00320 (373K) | 0.00284 (413K) |
| $b\ [\mu m]$ | 0.8 | 0.8 |
| $Q_{gb}\ [eV]$ | 0.5668 | 0.8099 |
| $\Delta\varphi\ [\text{deg.}]$ | -0.8 | -5.3 |
| $C_{gb}\ [KC/Js]$ | $-1.07 \times 10^{18}$ | $-1.07 \times 10^{20}$ |
| $\lambda\ [W/(\mu m \cdot K)]^{10}$ | $2.33 \times 10^{-4}$ | $2.33 \times 10^{-4}$ |
| $H\ [W/(\mu m^2 \cdot K)]$ | $5.6 \times 10^{-6}$ | $5.3 \times 10^{-6}$ |
| EFFECTIVE WIDTH OF SLITS $[\mu m]$ | 0.06 | 0.06 |

FIG.17

| | |
|---|---|
| $\rho_0$ [$\Omega \cdot \mu m$] | 3.99x10$^{-2}$ (393K) |
| $\alpha$ [/K] | 0.00301 (393K) |
| $\lambda$ [W/($\mu m \cdot K$)] | 1.55x10$^{-4}$ |
| $H$ [W/($\mu m^2 \cdot K$)] | 5.0x10$^{-6}$ |
| $Q_{lat}$ [eV] | 1.0155 |
| $C_{lat}$ [KC/Js] | 8.92x10$^{22}$ |

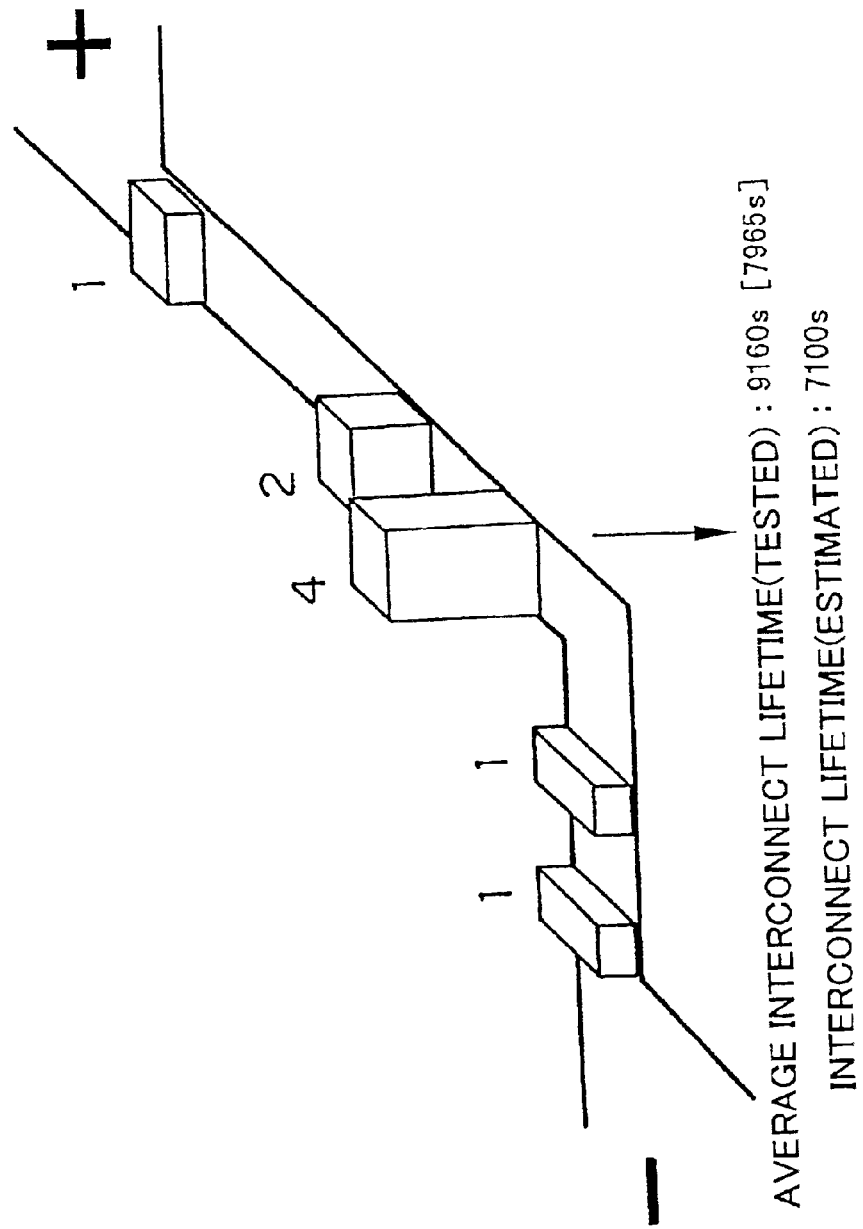

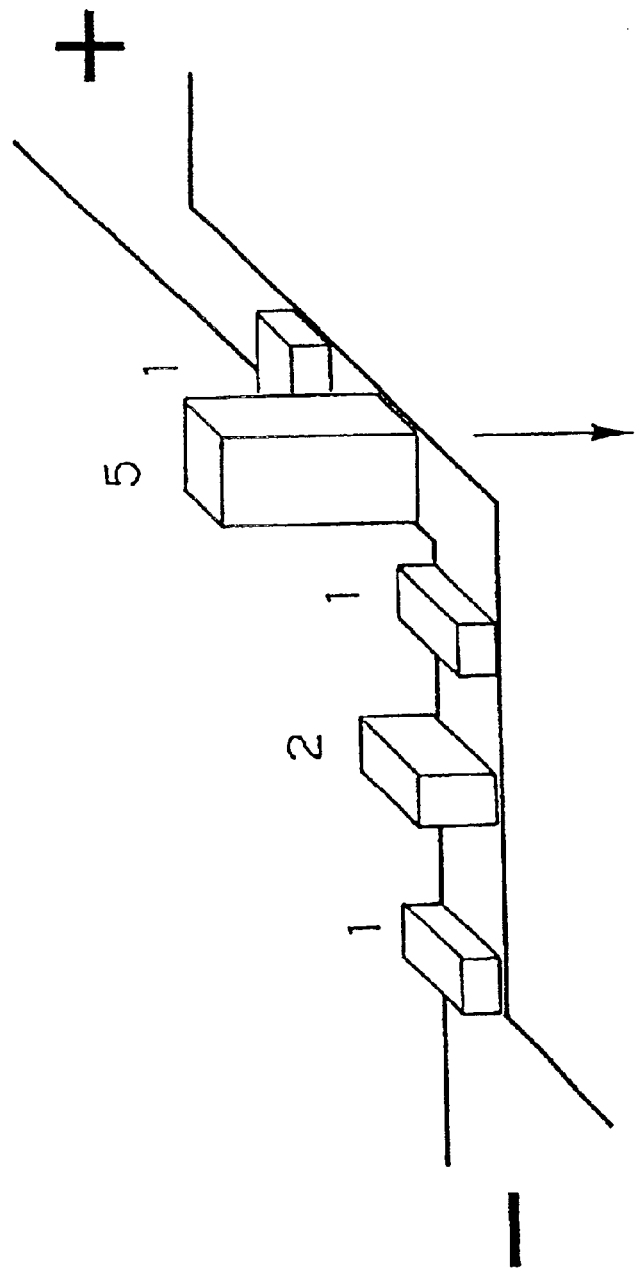

METAL INTERCONNECT RELIABILITY EVALUATION DEVICE, METHOD THEREOF, AND RECORDING MEDIUM STORING PROGRAM FOR EVALUATING RELIABILITY OF METAL INTERCONNECT

TECHNICAL FIELD

The present invention relates to techniques for predicting electromigration (EM) damage in metal interconnects, which is a cause of failures, and evaluating the reliability thereof.

BACKGROUND ART

Corresponding to the increased integration of semiconductor devices, there are considerable problems regarding the decreased reliability of metal interconnects connecting the microscopic elements that accompany such miniaturization. Electromigration (EM) is pointed to as the main cause of failures in the metal interconnects. EM is the phenomenon where atoms of metal structuring an interconnect migrate due to high density current. In places where atomic flux is uneven because of EM, localized loss and accumulation of atoms develops and is referred to as atomic flux divergence. This loss and accumulation of atoms leads to the occurrence of voids (clumps of vacancies) and hillocks (clumps of metallic atoms), respectively. As voids develop corresponding to stressing electric current and the cross-sectional area of the interconnect decreases, current density increases to cause localized increases in temperature and even melting. In order to ensure interconnect reliability, it is vital that EM damage, such as the formation of voids or hillocks, and failure, be accurately predicted.

Until now, the effects of two-dimensional current density and temperature distributions on the formation of voids has been studied, and it has become clear that the current density, current density gradient, temperature, temperature gradient of the interconnect as well as the material properties of the material forming the interconnect are the factors of void formation.

The key to EM damage prediction is the accurate and easy determination of how much atomic flux divergence is occurring. Until now, the atomic flux divergence has been formulated considering one-dimensional temperature distributions, and based on the failure prediction has been attempted for straight shaped polycrystalline interconnects. However, since the constitution of the crystal grains of an interconnect, or in other words the interconnect microstructure, is not taken into consideration, its suitability has been limited.

In addition, the study of atomic flux divergence in view of the two-dimensional distribution of current density and temperature for so-called 'bamboo' interconnects, which are strings of simple crystals, has not yet been carried out.

Interconnect lifetime estimation is performed by extrapolating the results of breakage testing under EM accelerated test conditions for normal conditions of use. For such extrapolation, empirical methods are used; however, problems such as differences in estimation results develop due to the selection of accelerated test conditions and interconnect layouts, and there has yet to be a universal lifetime estimation method.

DISCLOSURE OF THE INVENTION

The objective of the present invention is to perform prediction related to EM damage, which is the formation of voids and/or hillocks, and failure of an interconnect induced by the EM damage using the governing parameters of EM damage ($AFD_{gen}$), which represent atomic flux divergence in a polycrystalline interconnect and a bamboo interconnect. In order to achieve the above-mentioned objective, the present invention is characterized by obtaining current density and temperature distributions of a metal interconnect using numerical analysis methods; calculating the governing parameters for EM damage ($AFD_{gen}$) of each element using said current density and temperature distributions obtained as well as material property constants of an interconnect material; finding the reduction in volume of each element in each calculation step; and finding the change in thickness of each element while performing processing by repeating each operation until reaching the state where elements penetrating the thickness occupy the width of an interconnect, or reaching the state where elements penetrating the thickness and/or elements having a temperature exceeding the melting point of the material thereof occupy the width of an interconnect.

The above method is applicable for both a polycrystalline interconnect and a bamboo interconnect.

The present invention also includes a system for executing the above-mentioned method and a recording medium stored with a program for executing the above-mentioned method in a computer.

BRIEF DESCRIPTION OF DRAWINGS

FIGS. 4A, 4B, 4C and 4D are diagrams illustrating an example of the element mesh used in numerical simulation of a polycrystalline interconnect.

FIGS. 8A, 8B and 8C are diagrams showing the numerical simulation results of void distribution in a polycrystalline interconnect (Sample 1).

FIG. 14 shows the material property constants used in the numerical simulation of polycrystalline interconnects.

FIG. 17 shows the material property constants used in the numerical simulation of bamboo interconnects.

FIG. 24 is a diagram showing the test results in a bamboo interconnect (ASYM(+)).

FIG. 25 is a diagram showing the test results in a bamboo interconnect (SYM).

BEST MODE FOR CARRYING OUT THE INVENTION

An embodiment of the present invention is hereafter described in detail while referencing the attached drawings.

To begin with, a brief summary of the derivation of the governing parameters for EM damage ($AFD_{gen}$) is described.

Fundamental Equation

EM occurring in a metal thin-film interconnect develops along crystal grain boundaries as well as within the crystal grains as lattice diffusion. Consequently, the total sum of atomic flux divergence, $AFD_{gen}$ in an interconnect is represented by the sum of the atomic flux divergence occurring at the crystal grain boundaries and that within the crystal grains, and is defined as the following equation:

$$AFD_{gen} = AFD_{gb} + AFD_{lat} \quad (1)$$

Here $AFD_{gen}$ and $AFD_{lat}$ are the atomic flux divergence occurring at the crystal grain boundaries and that within a crystal grain, respectively. Expression (1) is applicable for both polycrystalline interconnects and bamboo interconnects. $AFD_{gb}$ and $AFD_{lat}$ can be derived in light of the interconnect microstructures of either a polycrystalline interconnect or bamboo interconnect. The following equation can be applied for atomic migration occurring both at the crystal grain boundaries and within a crystal grain:

$$|J| = \frac{ND}{kT} Z^* e \rho j^* \quad (2)$$

Here J is the atomic flux vector; N is atomic density; k is Boltzmann's constant; T is absolute temperature; Z* is the effective charge valence; e is the electronic charge; ρ is electrical resistivity; and D is the diffusion coefficient shown by the following equation:

$$D = D_0 \exp\left(-\frac{Q}{kT}\right) \quad (3)$$

Figure 1:
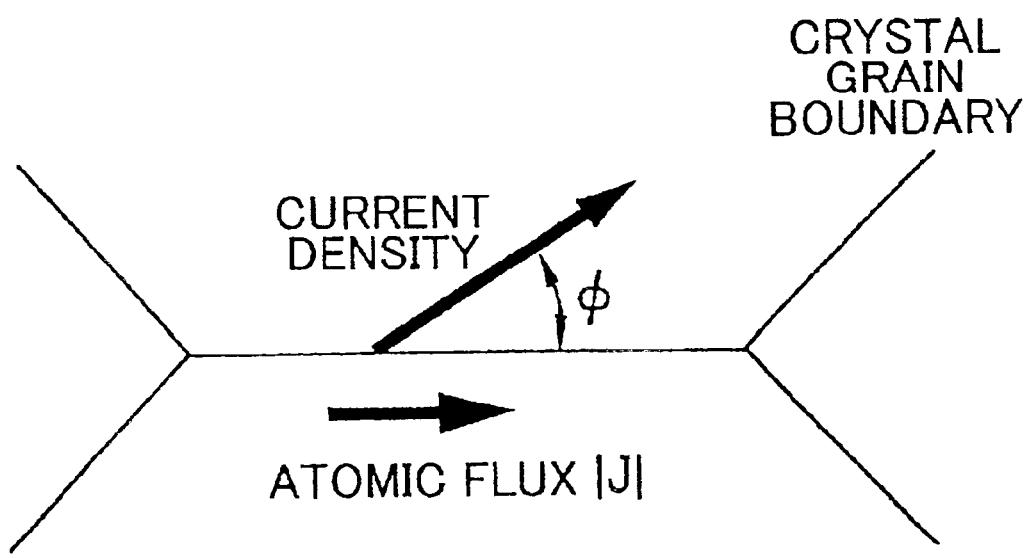
FIG. 1 is a diagram showing the atomic flux and current density at the boundaries of crystal grains.

Here $D_0$ is a prefactor and Q is activation energy. In addition, j* is current density in the J-direction. Since an atom migrates along a grain boundary within the crystal grain boundaries, j* can be said to be the crystal grain boundary directional component of current density vector j. On the other hand, since the directions of J and j agree within a crystal grain, j* becomes equal to |j|. As shown in FIG. 1, if the angle between j and a crystal grain boundary is given as θ, then $$j^* = \begin{cases} |j|\cos\phi & \text{(At Crystal Grain Boundaries)} \quad (4a) \\ |j| & \text{(Within Crystal Grains)} \quad (4b) \end{cases}$$

And Q takes the values for diffusion at the crystal grain boundary and that within the crystal grains, which are shown as $Q_{gb}$ and $Q_{lat}$, respectively.

Atomic Flux Divergence at Crystal Grain Boundaries

Figure 2:
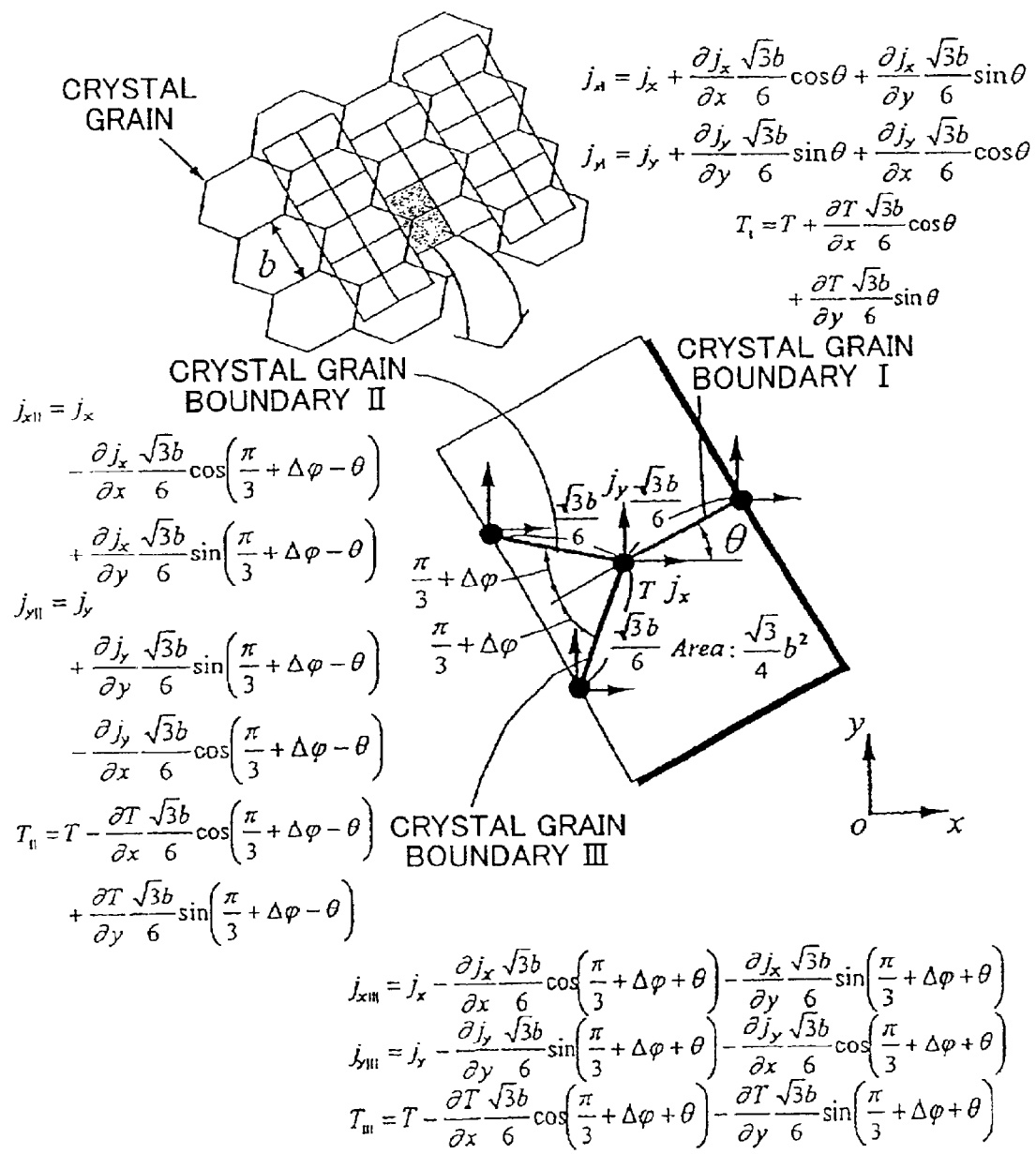
FIG. 2 is a diagram showing a model of the microstructure having rectangular components with unit thickness including only one triple point comprising three lines of crystal grain boundaries.

First, the atomic flux divergence at the crystal grain boundaries is considered. To begin with, the crystal grain boundaries in a polycrystalline interconnect are discussed. In order to consider the crystal grain boundaries in a polycrystalline interconnect, a model of the microstructure of the material is introduced. As shown in FIG. 2, a rectangular element of a unit thickness that includes only one triple point composed by three crystal grain boundaries having a length that is √3/6 times the average grain size b is assumed. The area of the same element is √3b²/4. Crystal grain boundaries II and III are symmetrical with respect to crystal grain boundary I, and the included angle therein is nearly 120° but it is assumed that there exists a slight variance of 2Δφ.

The x-directional component and y-directional component of current density vector j are given as $j_x$ and $j_y$, respectively, and since the angle between crystal grain boundary I and the x-axis is given as θ, the components of current density vector and temperature in the ends of crystal grain boundaries I, II, and III, as shown in FIG. 2, are respectively represented as the following:

$$j_y = j_x + \frac{\partial j_x}{\partial x}\frac{\sqrt{3}\,b}{6}\cos\theta + \frac{\partial j_y}{\partial y}\frac{\sqrt{3}\,b}{6}\sin\theta$$

$$j_x = j_y + \frac{\partial j_y}{\partial y}\frac{\sqrt{3}\,b}{6}\sin\theta + \frac{\partial j_x}{\partial x}\frac{\sqrt{3}\,b}{6}\cos\theta$$

$$T_s = T + \frac{\partial T}{\partial x}\frac{\sqrt{3}\,b}{6}\cos\theta + \frac{\partial T}{\partial y}\frac{\sqrt{3}\,b}{6}\sin\theta$$

$$j_{xii} = j_x - \frac{\partial j_x}{\partial x}\frac{\sqrt{3}\,b}{6}\cos\left(\frac{\pi}{3} + \Delta\varphi - \theta\right) + \frac{\partial j_y}{\partial y}\frac{\sqrt{3}\,b}{6}\sin\left(\frac{\pi}{3} + \Delta\varphi - \theta\right)$$

$$j_{yii} = j_y + \frac{\partial j_y}{\partial y}\frac{\sqrt{3}\,b}{6}\sin\left(\frac{\pi}{3} + \Delta\varphi - \theta\right) - \frac{\partial j_x}{\partial x}\frac{\sqrt{3}\,b}{6}\cos\left(\frac{\pi}{3} + \Delta\varphi - \theta\right)$$

$$T_a = T - \frac{\partial T}{\partial x}\frac{\sqrt{3}\,b}{6}\cos\left(\frac{\pi}{3} + \Delta\varphi - \theta\right) + \frac{\partial T}{\partial y}\frac{\sqrt{3}\,b}{6}\sin\left(\frac{\pi}{3} + \Delta\varphi - \theta\right)$$

$$j_{xan} = j_x - \frac{\partial j_x}{\partial x}\frac{\sqrt{3}\,b}{6}\cos\left(\frac{\pi}{3} + \Delta\varphi + \theta\right) - \frac{\partial j_y}{\partial y}\frac{\sqrt{3}\,b}{6}\sin\left(\frac{\pi}{3} + \Delta\varphi + \theta\right)$$

-continued $$j_{yan} = j_y - \frac{\partial j_y}{\partial y}\frac{\sqrt{3}b}{6}\sin\left(\frac{\pi}{3} + \Delta\varphi + \theta\right) - \frac{\partial j_x}{\partial x}\frac{\sqrt{3}b}{6}\cos\left(\frac{\pi}{3} + \Delta\varphi + \theta\right)$$

$$T_{an} = T - \frac{\partial T}{\partial x}\frac{\sqrt{3}b}{6}\cos\left(\frac{\pi}{3} + \Delta\varphi + \theta\right) - \frac{\partial T}{\partial y}\frac{\sqrt{3}b}{6}\sin\left(\frac{\pi}{3} + \Delta\varphi + \theta\right)$$

By substituting the above current density vector components and temperatures into equations (2) and (3), the atomic flux along the crystal grain boundaries at the respective crystal grain boundary ends can be obtained. Here the direction going from the element to the outside is defined as positive. By multiplying the atomic flux at the respective ends of crystal grain boundaries I, II, and III by width δ of the grain boundary and the unit thickness, the number of atomic migrations per unit time at the respective grain boundaries are obtained and added together. The sufficiently small term may then be neglected, and the equation is further simplified using the current conservation law and divided by the volume of the element $\sqrt{3}b^2/4$. Thus, the reduced number of atoms per unit time and unit volume, more specifically the atomic flux divergence $AFD_{gb\theta}$, in the crystal grain boundary diffusion when the angle between crystal grain boundary I and the x-axis becomes θ can be given as the following.

$$AFD_{gb\theta} = C\delta\rho\frac{4}{\sqrt{3}b^2}\frac{1}{T}\exp\left(-\frac{Q_{gb}}{kT}\right)\times\left[\sqrt{3}\,\Delta\varphi(j_x\cos\theta + j_y\sin\theta) - \right.$$

$$\frac{b}{2}\Delta\varphi\left\{\left(\frac{\partial j_x}{\partial x} - \frac{\partial j_y}{\partial y}\right)\cos2\theta + \left(\frac{\partial j_x}{\partial y} + \frac{\partial j_y}{\partial x}\right)\sin2\theta\right\} +$$

$$\left.\frac{\sqrt{3}b}{4T}\left(\frac{Q_{gb}}{kT} - 1\right)\left(\frac{\partial T}{\partial x}j_x + \frac{\partial T}{\partial y}j_y\right)\right]$$

Here C is given as equal to $ND_0Z^*e/k$; ρ is the local resistivity depending on temperature; and $Q_{gb}$ is the activation energy for the crystal grain boundary diffusion. The first term within the brackets on the right hand side of equation (5) is the term related to the atomic flux divergence at the triple point of crystal grain boundaries, and the second and third terms are the terms related to the atomic flux divergence at the crystal grain boundaries themselves. In addition, when $AFD_{gb\theta}$ is a positive value, it means that voids (clumps of vacancies) are formed and when it is a negative value, hillocks (dumps of metallic atoms) are formed.

When actual interconnects are contemplated, θ takes an arbitrary value. Therefore, it is necessary to find the flux divergence allowing for the entire range of values possible for θ (0<θ<2 π). If taking notice of the void formation at here, only positive expected values of $AFD_{gb\theta}$ can be found for cases where θ is changed from 0 to 2 π. Since negative values of $AFD_{gb\theta}$ do not contribute to the formation of voids, they should be treated as zero. By adding $AFD_{gb\theta}$ and the absolute value of $AFD_{gb\theta}$ and then dividing by 2, the positive value of $AFD_{gb\theta}$ contributing to void formation can be extracted. As a result, the atomic flux divergence $AFD_{gb}$ relating to void formation at the crystal grain boundaries in a polycrystalline interconnect is derived as the following equation:

$$AFD_{gb} = \frac{1}{4\pi}\int_0^{2\pi}(AFD_{gb\theta} + |AFD_{gb\theta}|)d\theta \qquad (6)$$

(Polycrystalline Interconnect)

Next, crystal grain boundaries in a bamboo interconnect are treated. There are few crystal grain boundaries existing in bamboo interconnects; however, when they do exist, since they are perpendicular to the length of the interconnect, atomic flux divergence at the crystal grain boundaries may be neglected in a bamboo interconnect. Therefore, the following equation is obtained:

$$AFD_{gb}=0 \text{(Bamboo Interconnect)} \qquad (7)$$

Atomic Flux Divergence within a Crystal Grain

Lattice diffusion due to EM within a crystal grain is now considered. Lattice diffusion can be treated the same for a polycrystalline interconnect as for a bamboo interconnect. It is possible to perform vector analysis regarding atomic flux vector J within a crystal grain. Based on equations (2), (3), and (4b), $AFD'_{lat}$, which is the reduced number of atoms per unit time and unit volume, can be obtained with the following equation:

$$AFD'_{lat} = divJ \qquad (8)$$

$$= C\rho\frac{1}{T^2}\left(\frac{Q_{lat}}{kT} - 1\right)\exp\left(-\frac{Q_{lgt}}{kT}\right)\left(\frac{\partial T}{\partial x}j_x + \frac{\partial T}{\partial y}j_y\right)$$

Here, $Q_{lat}$ denotes the activation energy for in-grain diffusion, which is dominant in lattice diffusion. Moreover, in the same way as the derivation of atomic flux divergence $AFD_{gb}$ at the crystal grain boundaries, if just void formation is looked at, the atomic flux divergence related to void formation within crystal grains of a polycrystalline interconnect and a bamboo interconnect can be derived as the following equation:

$$AFD_{lat}=1/2(AFD'_{lat}+|AFD'_{lat}|) \qquad (9)$$

Governing Parameters for EM Damage in Polycrystalline Interconnect and Bamboo Interconnect Atomic flux divergence occurring in a polycrystalline interconnect or a bamboo interconnect is now contemplated based on the total sum, of the atomic flux divergence in an interconnect, $AFD_{gen}$, expressed by the sum of $AFD_{gb}$ and $AFD_{lat}$ in equation (1).

At normal operating temperatures, the atomic flux divergence within a crystal grain is so small in comparison to that at the crystal grain boundary, and it can be neglected. Accordingly, for atomic flux divergence occurring in a polycrystalline interconnect, it is sufficient to consider only the atomic flux divergence occurring at crystal grain boundaries. As a result, the governing parameter of EM damage in a polycrystalline interconnect can be represented with the following equation:

$$AFD_{gen} = \frac{1}{4\pi}\int_0^{2\pi}(AFD_{gb\theta} + |AFD_{gb\theta}|)d\theta \qquad (10)$$

(Polycrystalline Interconnect)

From equation (10) and equation (5), one can see that current density, the current density gradient, temperature and the temperature gradient exert influence on atomic flux divergence in a polycrystalline interconnect.

Next, atomic flux divergence in a bamboo interconnect is considered. Since atomic flux divergence occurring in a bamboo interconnect can be represented by the sum of equation (7) and equation (9), only the divergence within a crystal grain needs to be considered. Accordingly, the governing parameter of EM damage in a bamboo interconnect can be represented with the following equation:

$$AFD_{gen}=1/2(AFD_{lat}+|AFD_{lat}|)\text{(Bamboo Interconnect)} \qquad (11)$$

Current density and temperature distributions applicable to the parameter's formulae can be found through numerical analysis. The fundamental equations of analysis are expressed as follows:

The equation governing the potential $\theta_e$ of the electrical field can be denoted as $$\nabla^2 \phi_e = 0 \quad (12)$$

Ohm's law can be represented as $$j = -\frac{1}{\rho_0} grad \phi_u \quad (13)$$

The equation of steady state heat conduction is $$\lambda \nabla^2 T + \rho_0 j \cdot j + (\rho_0 \alpha j \cdot j - H)(T - T_s) = 0 \quad (14)$$

Here, the resistivity is assumed to be constant, when solving for the current, H is the constant regarding heat flow from an interconnect to the surroundings, and $\nabla^2$ is given as equal to $\partial^2/\partial x^2 + \partial^2/\partial y^2$.

The material property constants of the interconnect material are determined through an acceleration test using a straight interconnecting line. Constants $\rho_0$ and $\alpha$ are obtained by measuring the electrical resistance of the interconnect. Constant H is determined so that the value of electrical resistance of the interconnect computed based on the temperature distribution obtained from numerical analysis becomes equal to the measured value. The activation energy $Q_{gb}$ for a polycrystalline interconnect is given from the slope of the plot of $\ln VT/(j_{in} \rho)$ with $1/T$. For this, $j_{in}$ is the input current density and V and T are the volume of voids in the central region of the interconnect after current-stressing for a certain time, and those are given under the three conditions of acceleration. The volume of the voids is estimated by multiplying the total area of the voids measured with a scanning electron microscope (SEM) by the thickness of the interconnect. Likewise, activation energy for lattice diffusion $Q_{lat}$ in a bamboo interconnect is found from the slope obtained by plotting $\ln VT^2/\rho$ with $1/T$. For this, V and T are the volume of the voids and temperature near the cathode end of the line under three kind of the substrarate temperature. V is obtained by inputting a current density for a certain time and measuring the area near the cathode end of each of the straight bamboo interconnect of each after their respective current stressing using an atomic force microscope (AFM). Constant $\Delta \phi$ is determined so that the computed value of the ratio of the void volume within the central region of the interconnect to the void volume around the end of the cathode side becomes equal to the measured ratio of the volumes. Constant $C_{gb}$ is obtained from the relationship between the void volume measured through the testing and the computed value. In this manner, all of the unknown constants are allowed to be determined from only the test results using straight interconnecting lines.

Numerical Simulation Using $AFD_{gen}$

The lifetime and locations of failure in metal interconnects are estimated by performing numerical simulation of processes covering the initiation of voids, their growth and the eventual breakage/failure using $AFD_{gen}$ for a polycrystalline interconnect or a bamboo interconnect. For this, the changes in current density and temperature distributions accompanying void growth are considered in the calculation of $AFD_{gen}$.

In the numerical simulation, a metal interconnect is divided into elements. The smaller the size of element used, the closer to actual phenomenon the results obtained are.

Figure 3:
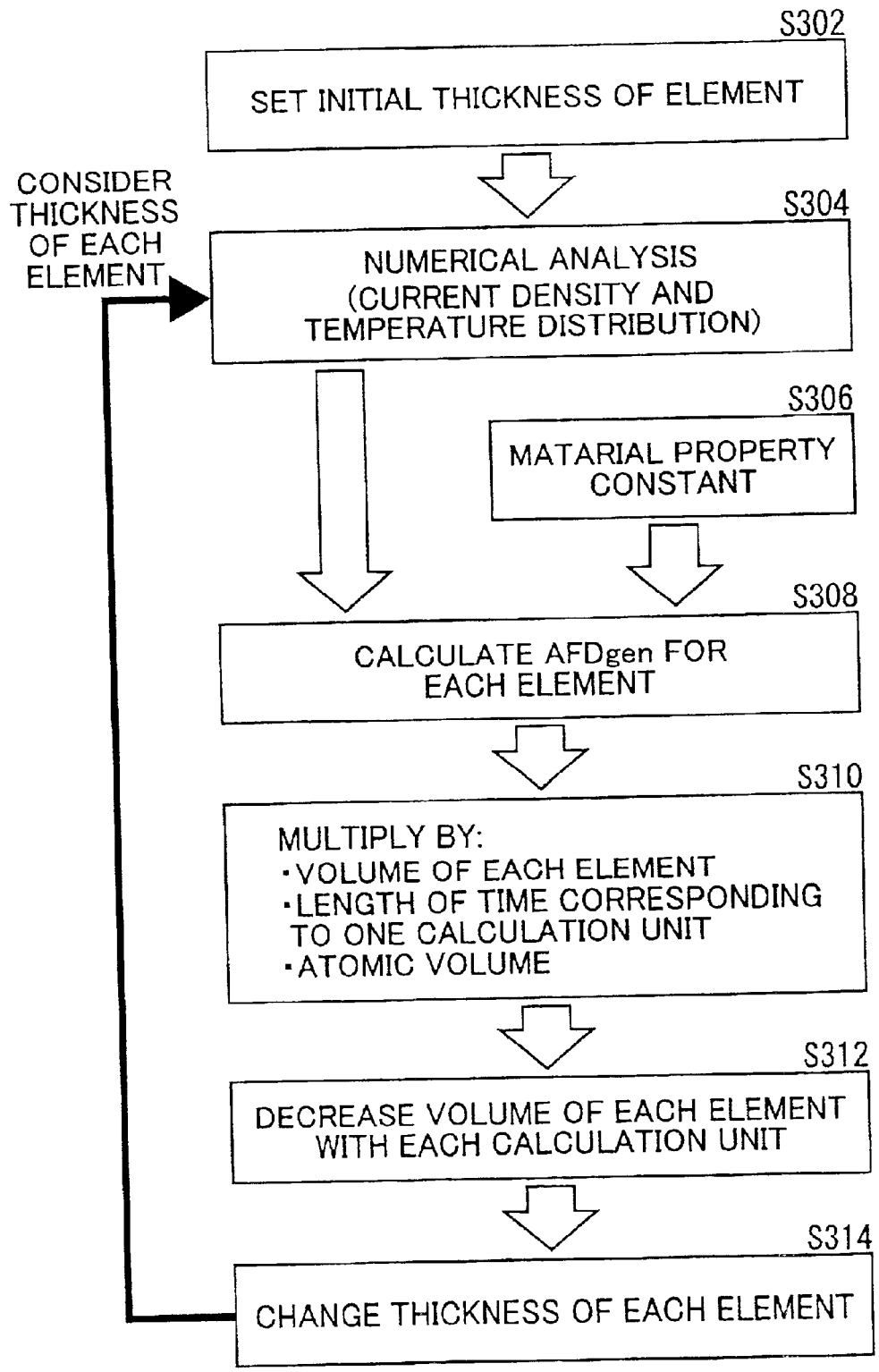
FIG. 3 is a flowchart showing the processing of a numerical simulation.

The thickness of each element changes with the iteration shown in the flowchart of FIG. 3. To begin with, current density and temperature distributions are obtained by a numerical analysis method such as two-dimensional finite element analysis (FEM analysis) (S304). Atomic flux divergence $AFD_{gen}$ of each element is calculated (S308) using the distributions and the material property constants of the interconnect material determined by their distribution and acceleration testing done beforehand (S306). The reduction in element volume per calculation step in the simulation (S312) is found by multiplying the volume of each element, the time corresponding to one calculation step, and the atomic volume (S310). Here, one calculation step is assigned to the actual time. The amount of volume reduction is converted into the amount of the reduction of thickness for each element (S314). A reduction in the thickness of an element shows that a void has formed, and the depth of the void correlates to the reduction in thickness of the element. Numerical analysis of the current density and temperature distributions in the metal interconnect is once again performed in light of the thickness of each element (S304). In this manner, the calculations shown in FIG. 3 are repeated.

Numerical Simulation for Polycrystalline Interconnect

Numerical simulation for a polycrystalline interconnect using the above-mentioned procedure allows for sufficient prediction of void distributionafter a certain length of time has passed and location of failures. In order to further predict lifetime, it is necessary to take the following into consideration in the simulation: the morphology of voids in a polycrystalline interconnect, namely the extension along the width of the interconnect of slit-like voids selectively growing along the crystal grain boundaries and connecting together. The parameter $AFD_{gen}$ is derived based on the assumption that void formation occurs at the boundaries of crystal grains; however, this is ultimately expanded to the expected amount of void formation occurring at an arbitrary point in the metal interconnect. For this reason, the pattern of void formation is once again converted into a slit-like void formation along the crystal grain boundaries. In the generation of element mesh of the interconnect, an exclusive element for the configuration of slit-like voids is arranged as in FIG. 4. Here, FIG. 4A shows an example of a finite element model of an interconnect that is used later in FIG. 6. FIGS. 4B, 4C, and 4D are enlarged views of the respective locations.

The thickness of the exclusive elements for slit-like voids decreases based on the calculations of $AFD_{gen}$ in the element and the neighboring elements. The pitch of the slits is determined by the average size of the crystal grains. The width of the slit is one of the material property constants of the interconnect material and may be obtained by the following procedure shown in FIG. 5.

Figure 5:
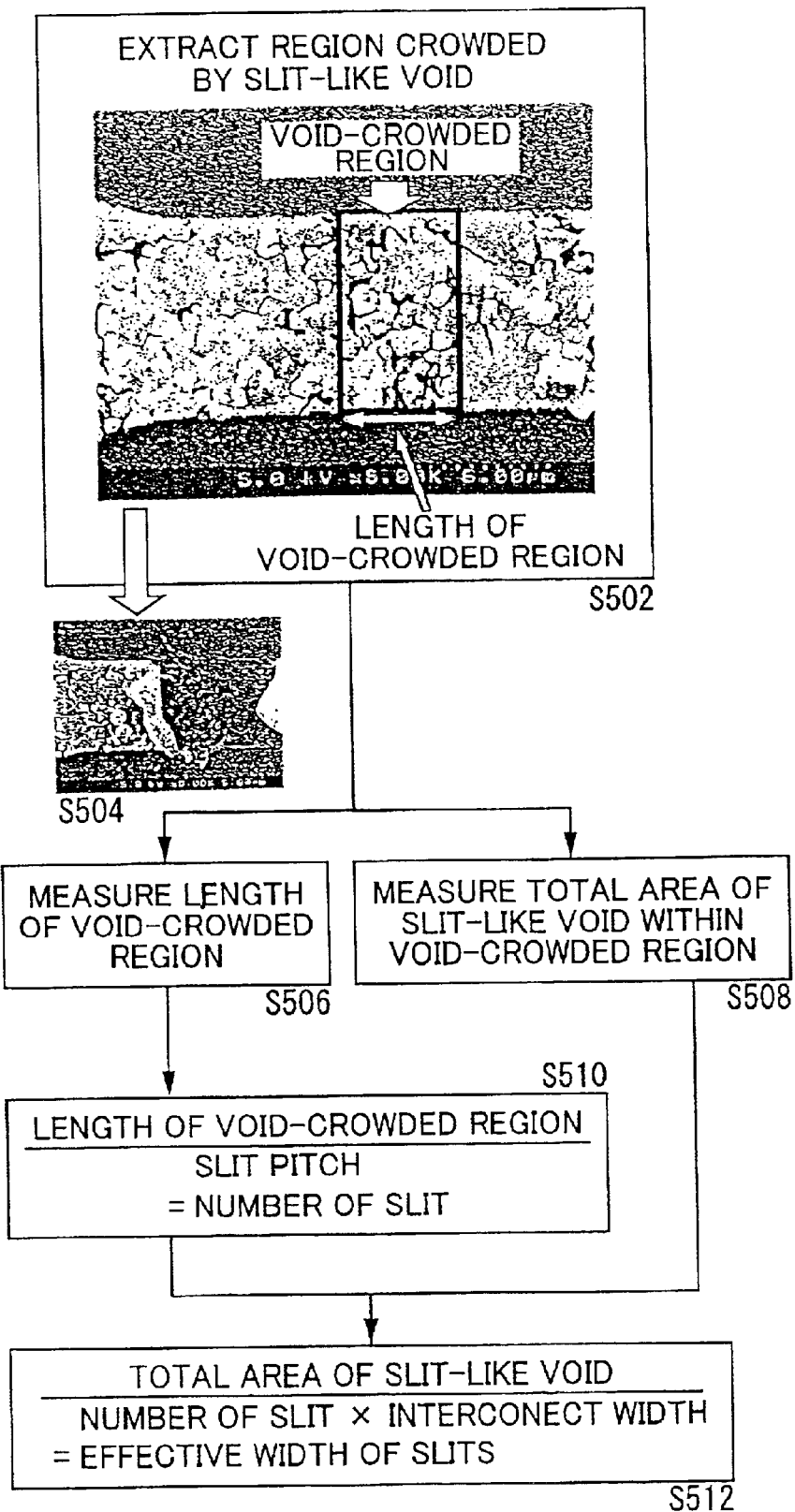
FIG. 5 is a flow chart showing the sequence used to obtain the effective width of a slit, which is a material property constant of the interconnect material.

In FIG. 5, while performing SEM observation, acceleration testing is employed until failure occurs (S504). From the SEM image of the metal interconnect obtained just before the failure, the region containing a high concentration of slit-like voids, namely the site where failure will happen soon, is extracted (S502). The length of the void-crowded region along the lengthwise-axis of an interconnect is divided according to the pitch of the slits (S506), and the number of slits included in the crowded region is obtained (S510). On the other hand, the total area of the slit-like voids throughout the crowded region is measured (S508). If the total area of the voids is divided by the interconnect width and the number of slits, the effective width of the slits used in the simulation may be obtained (S512). The test for the determination of the slit width is performed utilizing the samples used for setting constants $\rho_0$, $\alpha$, H, $\Delta \phi$ and $C_{gb}$.

In view of the change in the thickness of the exclusive elements for forming slit-like voids, the computational procedure of the numerical simulation for lifetime estimation is repeatedly executed until the failure of the metal interconnect, which is defined as the state where elements penetrating the thickness occupy the width of the interconnect, or where elements penetrating the thickness and elements having temperatures exceeding the melting point of the material occupy the width of the interconnect. In this manner, numerical simulation allows estimating of lifetime as well as failure location for a metal interconnect under operating conditions.

Verification of Estimation Prediction for Polycrystalline Interconnect

Figures 6A, 6B:
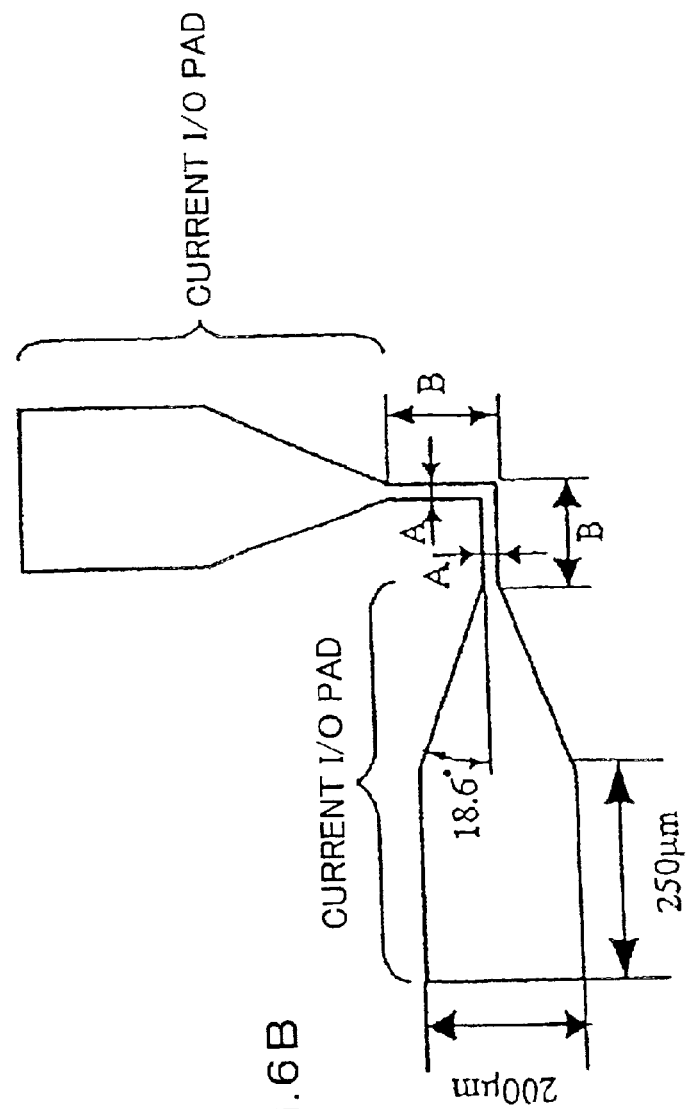
FIGS. 6A and 6B are diagrams showing two kinds of samples for which numerical simulation of a polycrystalline interconnect is performed.

The two kinds of aluminum polycrystalline interconnects shown in FIG. 6 have been used for estimating lifetime and failure location. An angle interconnect has a two-dimensional distributions of current density and temperature. Constants that are necessary for the estimation are found through simple acceleration testing using a straight interconnect. The two interconnects are called Sample 1 and Sample Z As shown in FIG. 6A, they not only differ in shape but also in testing conditions.

Figure 7A:
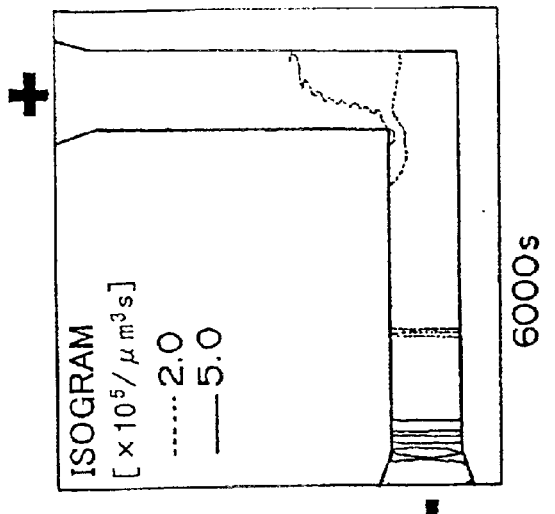
FIGS. 7A, 7B and 7C are diagrams showing the numerical simulation results of $AFD_{gen}$ distribution in a polycrystalline interconnect (Sample 1).
Figure 7B:
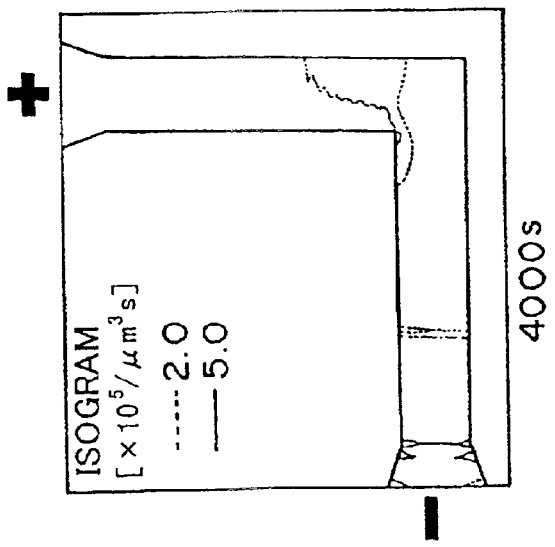
Figure 7C:
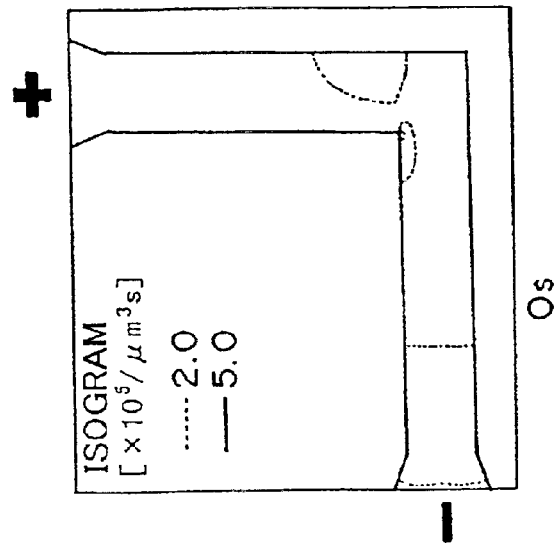
Figure 9C:
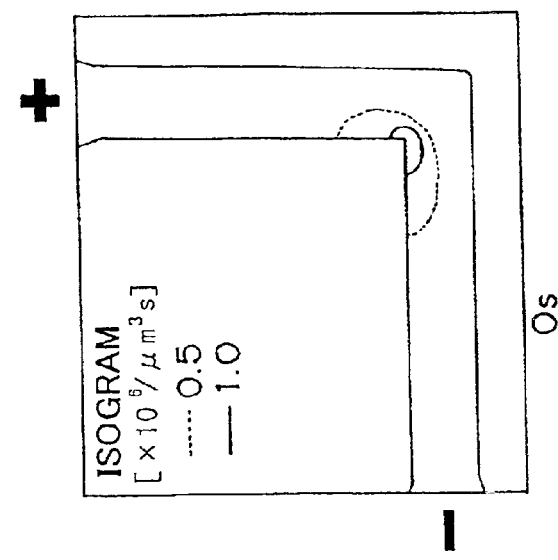
FIGS. 9A, 9B and 9C are diagrams showing the numerical simulation results of $AFD_{gen}$ distribution in a polycrystalline interconnect (Sample 2).
Figure 9B:
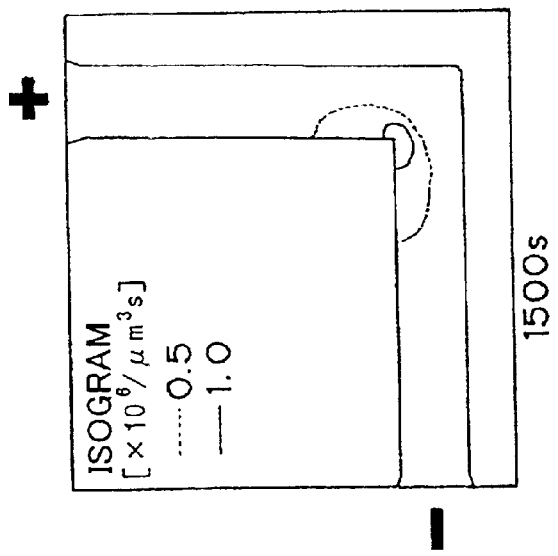
Figure 9A:
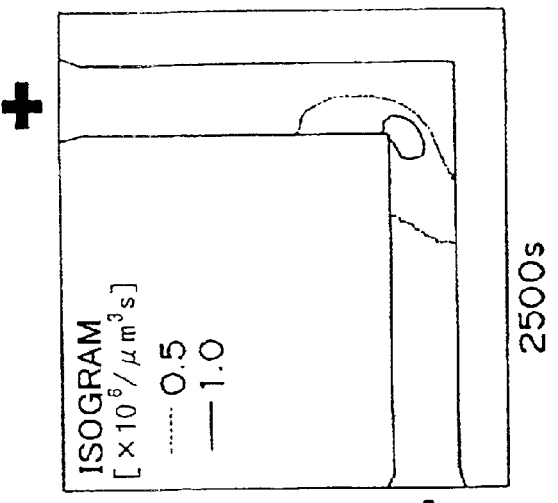
Figure 10C:
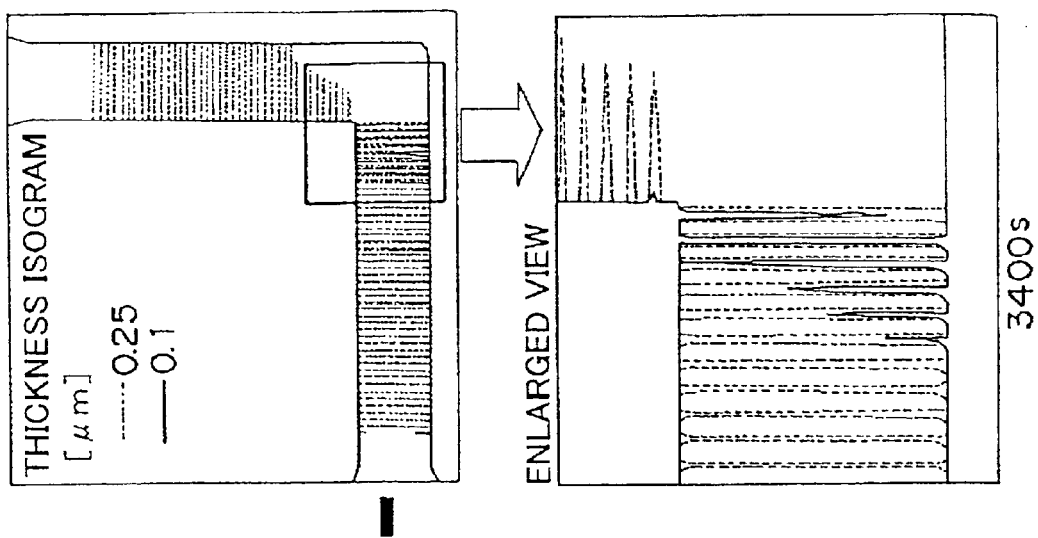
FIGS. 10A, 10B and 10C are diagrams showing the numerical simulation results of void distribution in a polycrystalline interconnect (Sample 2).
Figure 10B:
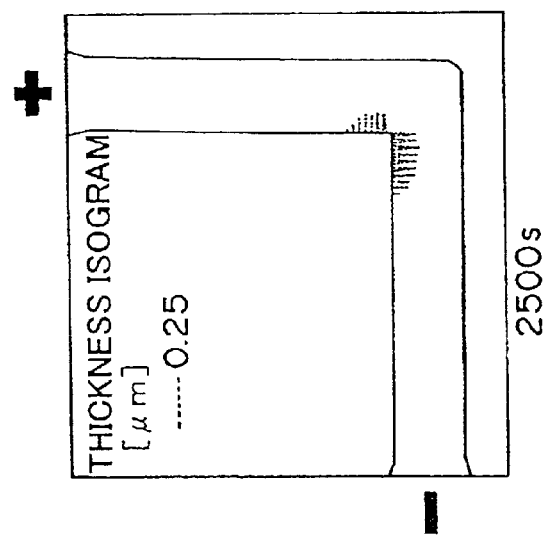
Figure 10A:
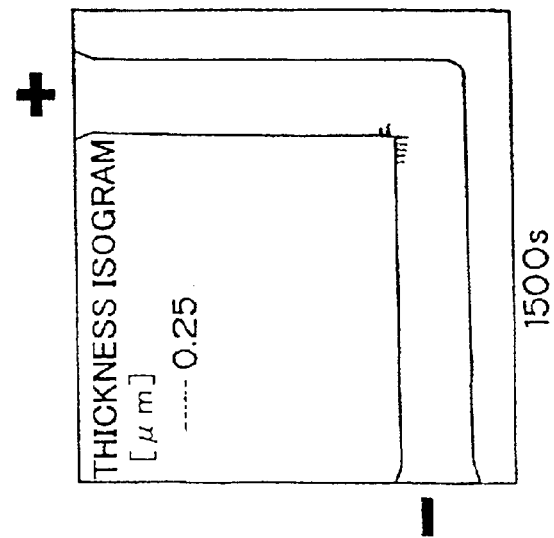

Compared with normal operating conditions, a higher density current and temperature have been selected as the testing conditions. The reason for this is in order to shorten the length of time necessary for testing of verification. The material property constants used for $AFD_{gen}$ calculation are found as shown in the table of FIG. 14. The average size of the crystal grains is measured using a focused ion beam (FIB) equipment. By performing numerical simulation, failure due to electromigration is respectively estimated for Sample 1 and Sample 2. The changes with time in $AFD_{gen}$ distribution and void distribution in Sample 1 are shown in FIG. 7 and FIG. 8, respectively. The changes with time in $AFD_{gen}$ distribution and void distribution in Sample 2 are shown in FIG. 9 and FIG. 10, respectively. The change in void distribution with respect to time is shown by isograms of the film thickness. Due to the change in current density and temperature distribution with void growth, $AFD_{gen}$ distribution changes with time. For Sample 1, metal interconnect failure is estimated to occur at a lifetime of 7700 s and the location of the failures is estimated to be at the cathode end. Meanwhile, failure in Sample 2 is estimated to be at a lifetime of 3400 s and the failure location is estimated to be in the cathode side of the corner.

Figure 11:
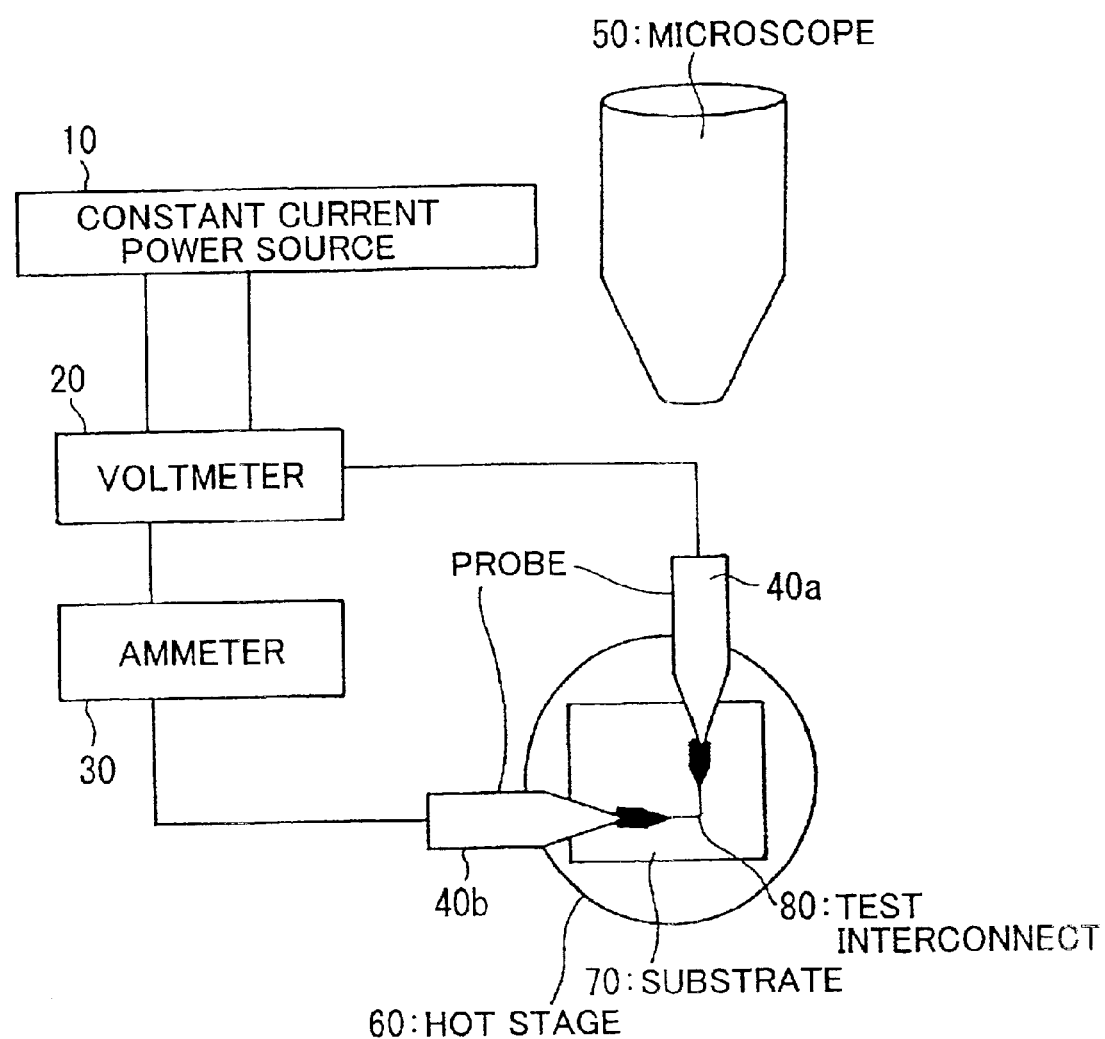
FIG. 11 is a block diagram illustrating a setup for verification testing.

In order to verify these estimated results, testing has been performed with the same size of interconnect and conditions as the simulation. Eleven specimens have been used for Sample 1, and 12 specimens have been used for Sample 2. A thin aluminum film is deposited onto a silicon substrate covered by a silicon oxide layer through vacuum evaporation. After annealing, the specimens are patterned using etching. The specimens are tested using the setup shown in FIG. 11 until the metal interconnects open. Afterwards, the specimens are observed through a SEM.

Figure 12A:
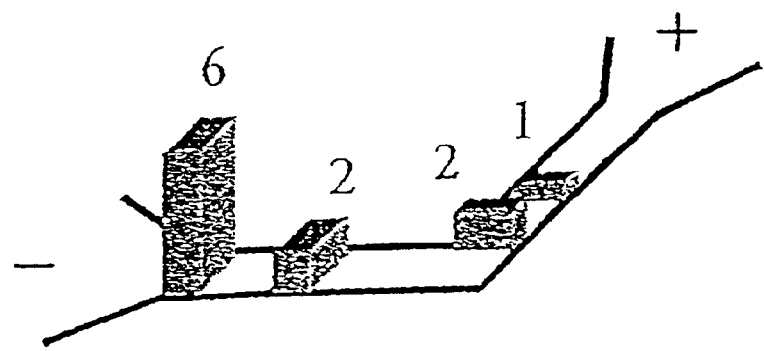
FIGS. 12A and 12B are diagrams showing the test results of a polycrystalline interconnect (Sample 1).
Figure 12B:
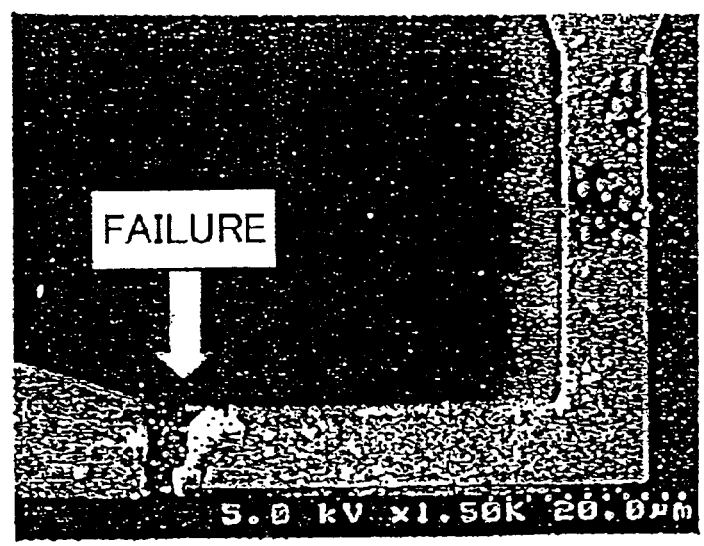
Figure 13A:
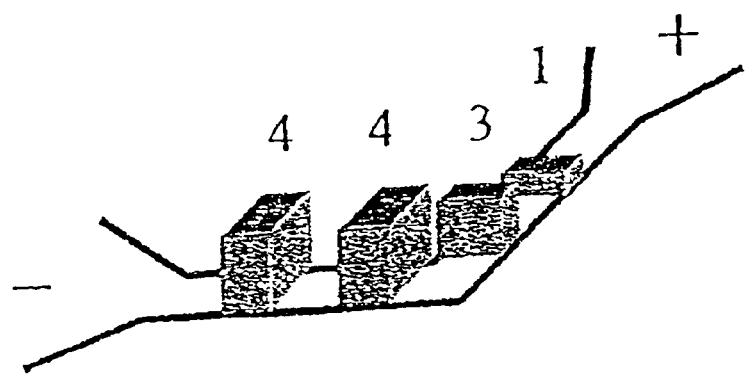
FIGS. 13A and 13B are diagrams showing the test results of a polycrystalline interconnect (Sample 2).
Figure 13B:
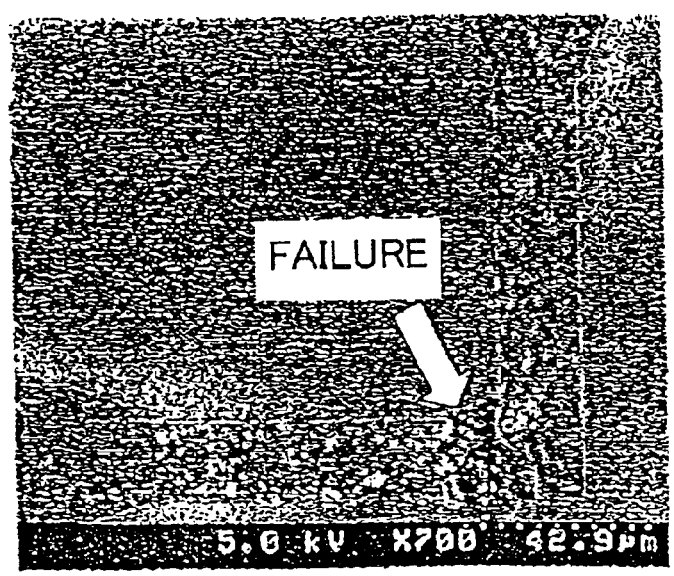

FIG. 12 and FIG. 13 show the test results for the frequency distribution of failure and the mean time to failure. As shown in FIG. 12A, with Sample 1, the mean time to failure obtained for all 11 specimens is 6731 s. The location where the frequency of failure is highest is the cathode end of the interconnect. The mean failure time of the 6 specimens that opened at the estimated failure location, namely the cathode end, is 6820 s, which is close to the mean time to failure of the 11 specimens. Meanwhile, with Sample 2, the mean time to failure obtained for all 12 specimens is 3655 s and the cathode side of the corner is one of the locations having the highest frequency of failure (see FIG. 13A).

Numerical Simulation for Bamboo Interconnect

Using the governing parameter $AFD_{gen}$ for EM damage in a bamboo interconnect, numerical simulation of the process covering void formation, its growth and ultimately failure due to EM is performed. Through this, predictions of the interconnect lifetime and failure location are possible considering the change with time in current density distribution and temperature distribution accompanying the formation and growth of voids.

Figure 15:
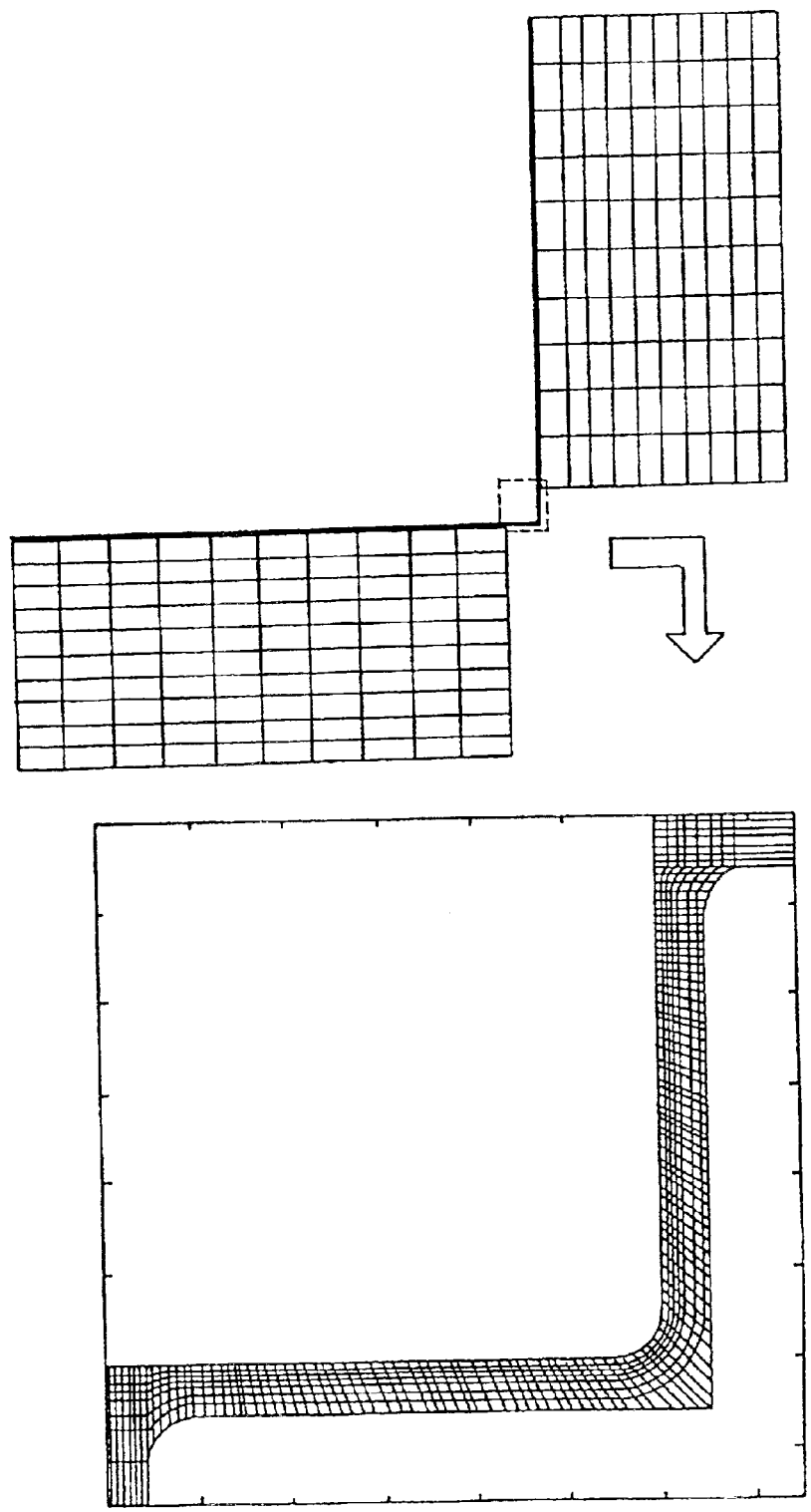
FIG. 15 is a diagram illustrating an example of element breakdown using numerical simulation of a 'bamboo' interconnect.

During simulation, the supposed interconnect is divided into elements as shown in FIG. 15, and the thickness of each of the elements is changed by the method shown in the flowchart of FIG. 3. The current density and temperature distributions within the interconnect are found using numerical analysis procedures such as two-dimensional finite element analysis (S304), and using those results and the material property constants of the interconnect found by testing in advance (S306), $AFD_{gen}$ for each element is calculated (S308). By multiplying these by the volume of each element, the length of time assigned to one time step of the simulation, and the atomic volume (S310), the volume of the reduction spanning one time step can be calculated for each element (S312). Here the length of time assigned for one time step corresponds to the actual length of time. The volume of each element decreases, and accordingly, the thickness of each element changes (S314). In elements in which thickness decreases, the void with depth corresponding to the decrement can be regarded as being formed. Next, upon consideration of the change in electrical resistance and change in conduction combustion of each element corresponding to the change in thickness, numerical analysis of current density and temperature is performed again and the calculations are repeated. The state that the elements having a thickness regarded sufficiently as being zero in comparison with the initial thickness occupy the width of an interconnect, or the state that the elements having a thickness regarded as zero and/or the elements having a temperature exceeding the melting point of the material occupy the width of the interconnect is defined as failure in the simulation and the calculation ends.

Verification of Prediction Method for Bamboo Interconnect

Figure 16:
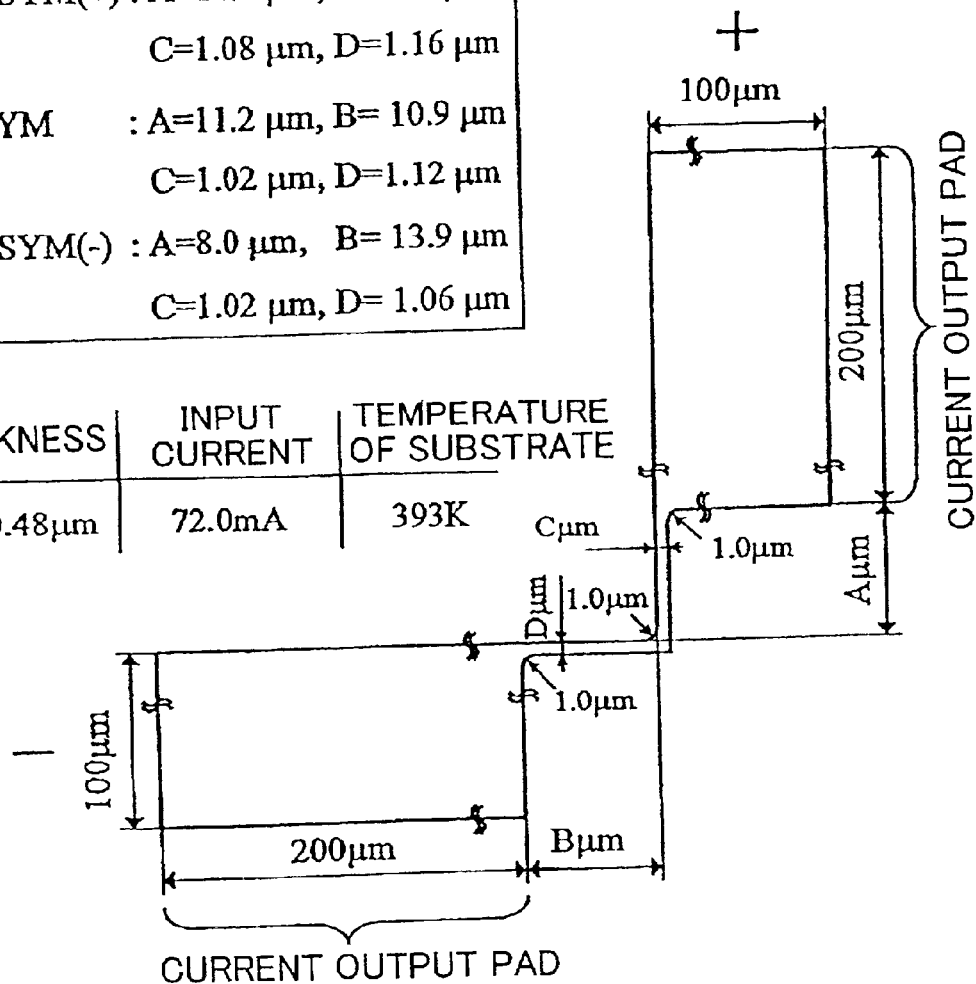
FIG. 16 is a diagram showing three kinds of samples performing numerical simulation of a bamboo interconnect.

The three types of Al bamboo interconnects shown in FIG. 16 have been used as the subject of failure prediction. For this, current density distribution and temperature distribution in an angled interconnect takes on a two-dimensional distribution. The length from the corner of the interconnect to the anode end is given as A, and the length from the corner of the interconnect to the cathode end is given as B. An interconnect with A=14.0 μm and B 8.0 μm is labeled ASYM(+), and an interconnect with A=11.2 μm and B=10.9 μm m is labeled SYM, and an interconnect with A=8.0 μm and B=13.9 μm is labeled ASYM(−). In each of the respective shapes, the testing conditions of input current density and substrate temperature have been made the same. The interconnect width is, as shown in FIG. 16, not fixed, but actually the width of the portion from the corner to the anode side end is slightly narrower than the cathode side portion. In order to shorten the length of time required for verification testing, a high-density current of approximately 15 $MA/cm^2$ and a temperature of 393 K, which are higher than normal conditions of use, have been selected for the testing conditions. The amount of current allowed to flow is 72.0 mA. The material properties value of the thin film necessary for $AFD_{gen}$ calculation have been found as shown in the table of FIG. 17. Note that in this estimation, constants H and A have been determined so that the electric resistance value calculated in the interconnect based on the simulation of temperature distribution using a two-dimensional finite element analysis for each of the respective straight interconnects and angled interconnects coincides with the interconnect resistance value measured by testing of each of the respective shapes. Normally the heat conductivity of thin film is said to be lower than that of bulk; the λ obtained is $1.55 \times 10^{-4}$ W/(μm·K), which is a value lower than the bulk. In the above manner, numerical simulation is performed using the material properties, and failure due to EM has been predicted for each of the three respective types of interconnects: ASYM(+), SYM, and ASYM(−).

Figure 18A:
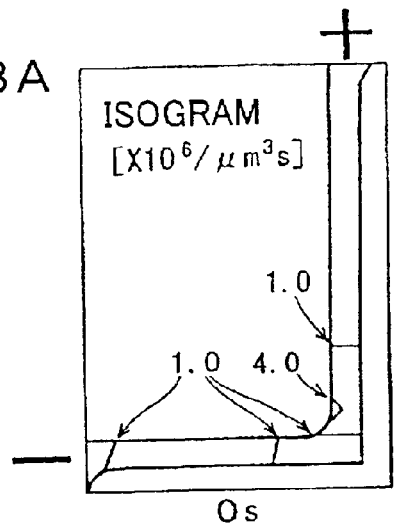
FIGS. 18A, 18B and 18C are diagrams showing the numerical simulation results of $AFD_{gen}$ distribution of a bamboo interconnect (ASYM(+)).
Figure 18B:
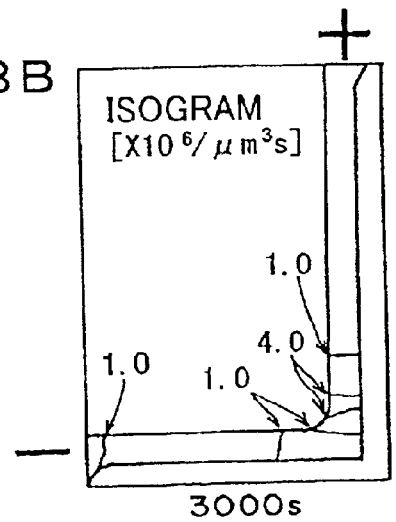
Figure 18C:
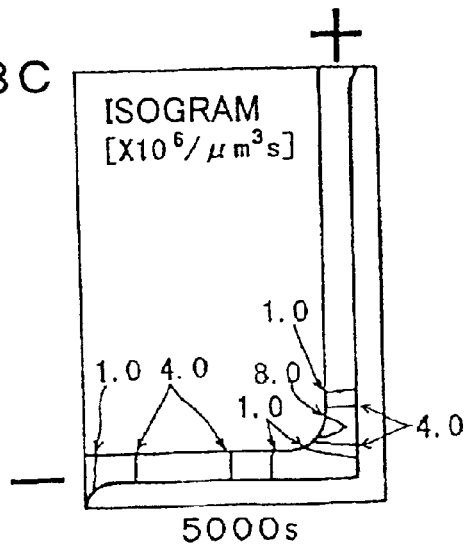
Figure 19A:
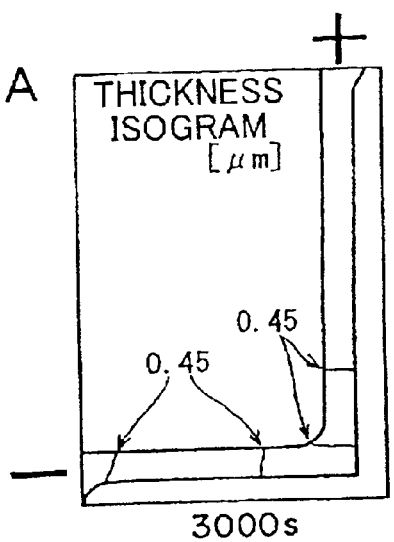
FIGS. 19A, 19B and 19C are diagrams showing the numerical simulation results of void distribution in a bamboo interconnect (ASYM(+)).
Figure 19B:
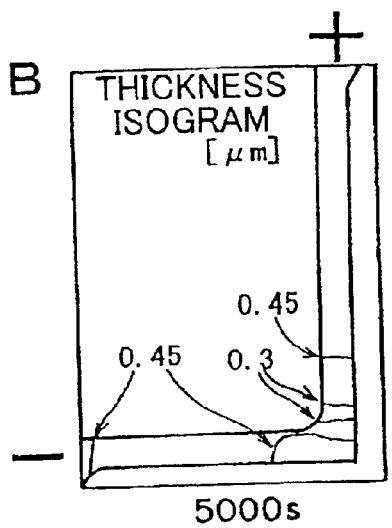
Figure 19C:
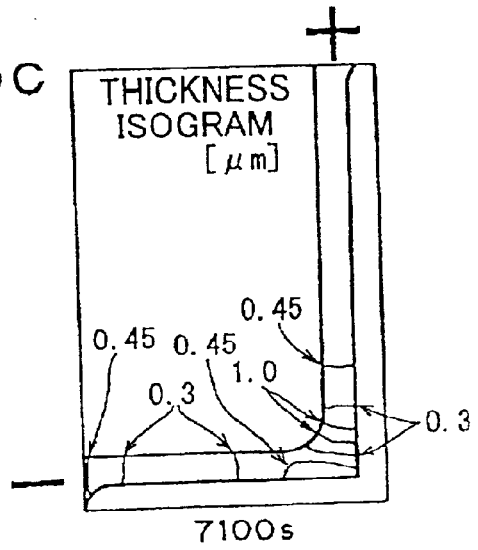
Figure 20A:
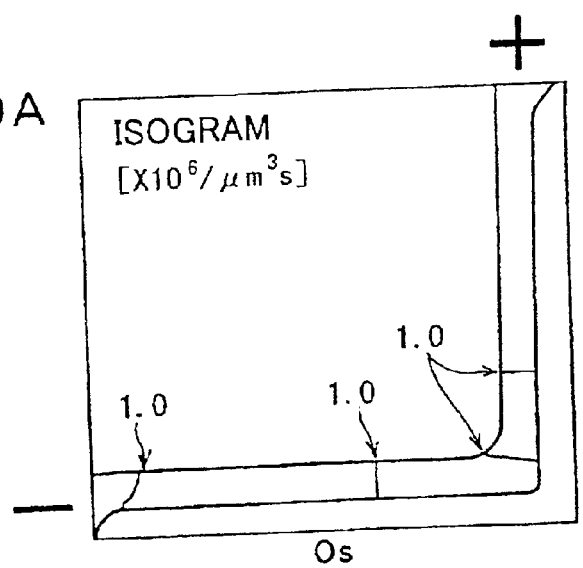
FIGS. 20A, 20B and 20C are diagrams showing the numerical simulation results of $AFD_{gen}$ distribution in a bamboo interconnect (SYM).
Figure 20B:
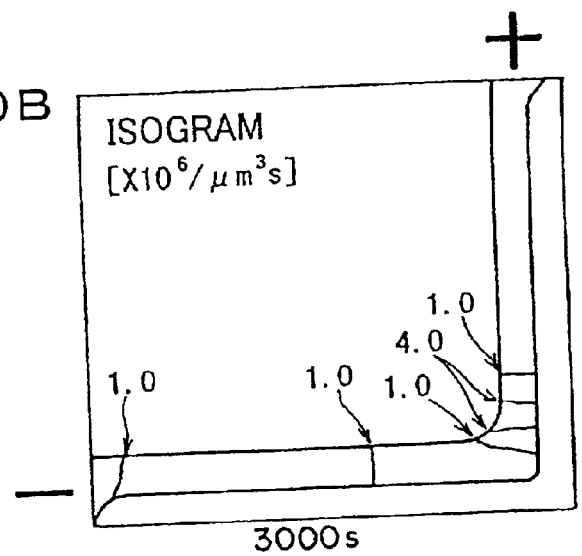
Figure 20C:
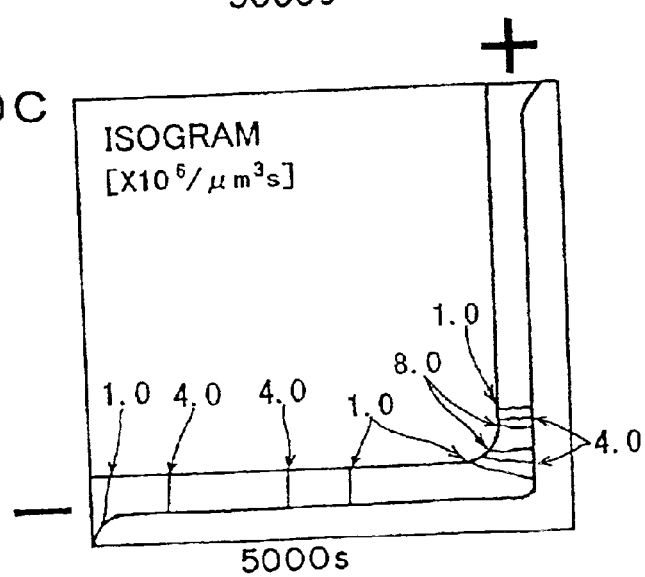
Figure 21A:
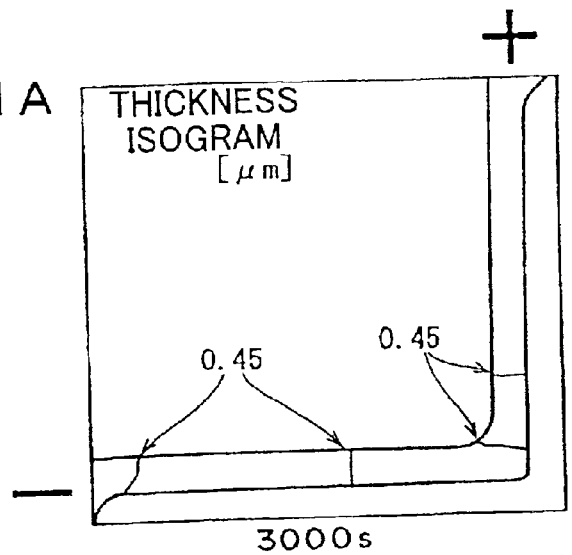
FIGS. 21A, 21B and 21C are diagrams showing the numerical simulation results of void distribution in a bamboo interconnect (SYM).
Figure 21B:
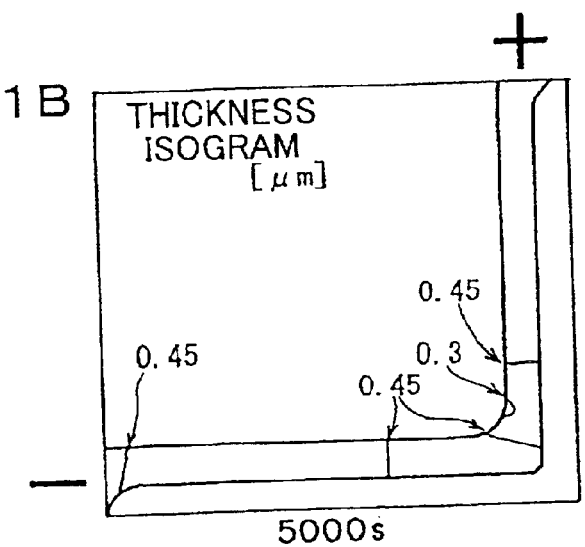
Figure 21C:
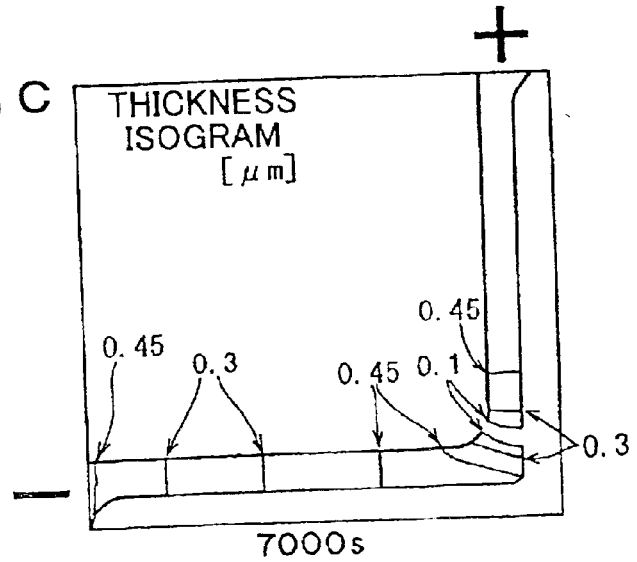
Figure 22A:
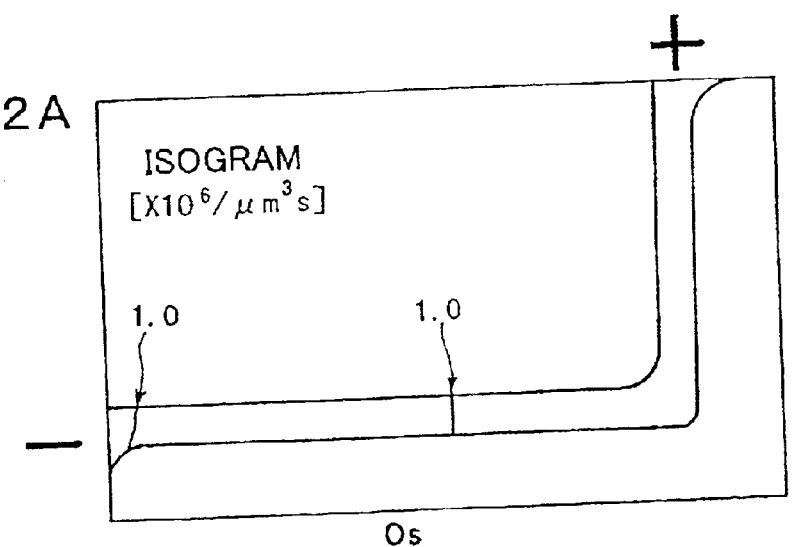
FIGS. 22A, 22B and 22C are diagrams showing the numerical simulation results of $AFD_{gen}$ distribution in a bamboo interconnect (ASYM(−)).
Figure 22B:
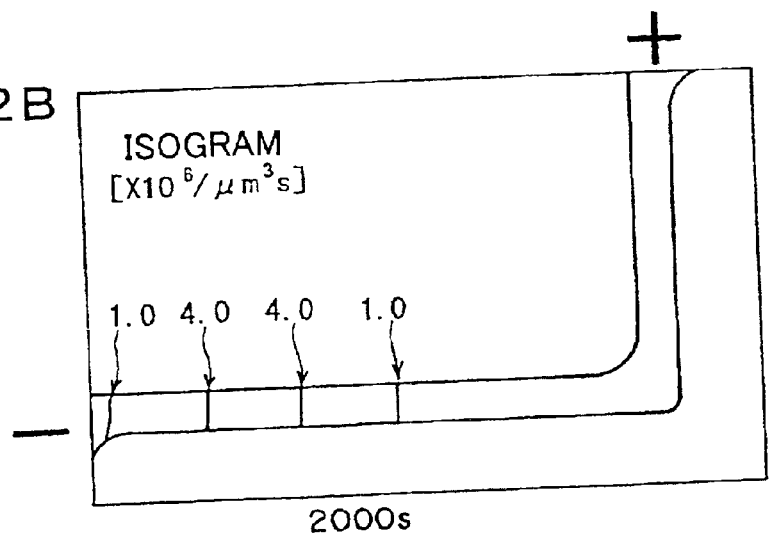
Figure 22C:
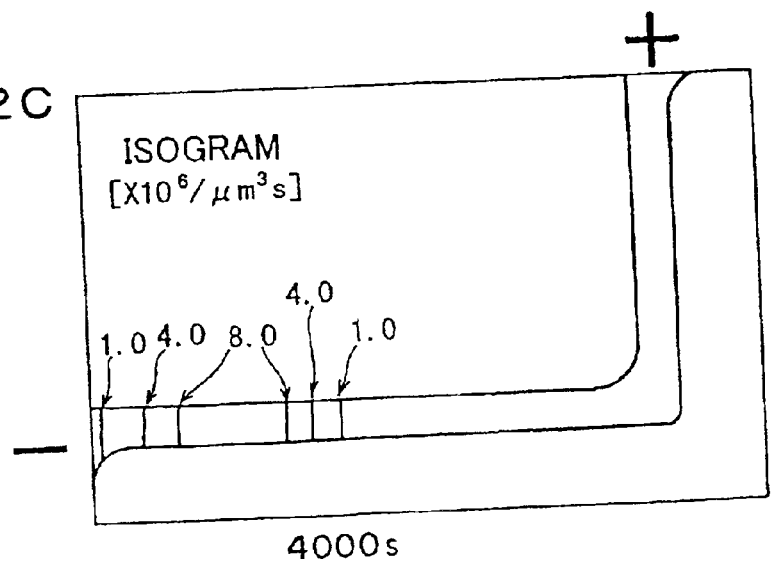
Figure 23A:
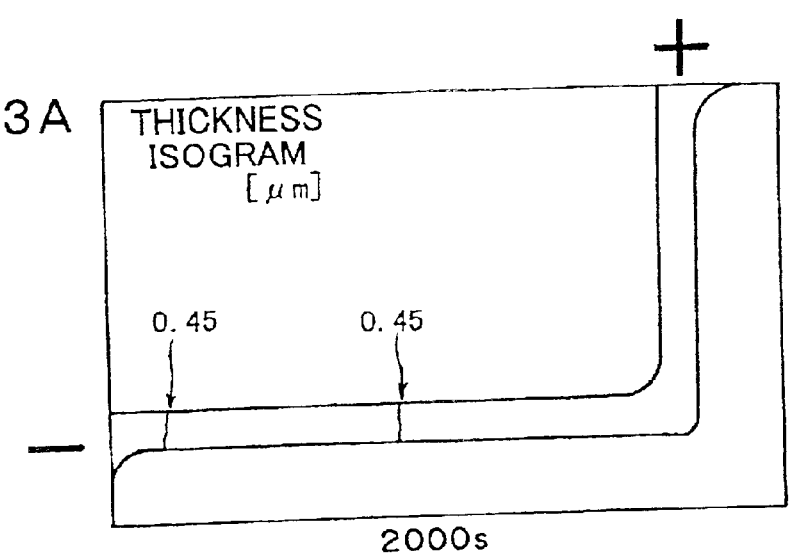
FIGS. 23A, 23B and 23C are diagrams showing the numerical simulation results of void distribution in a bamboo interconnect (ASYM(−)).
Figure 23B:
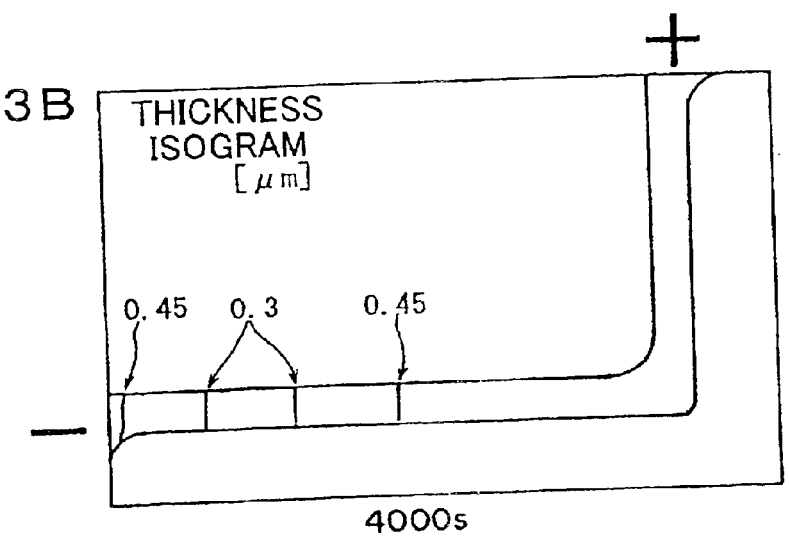
Figure 23C:
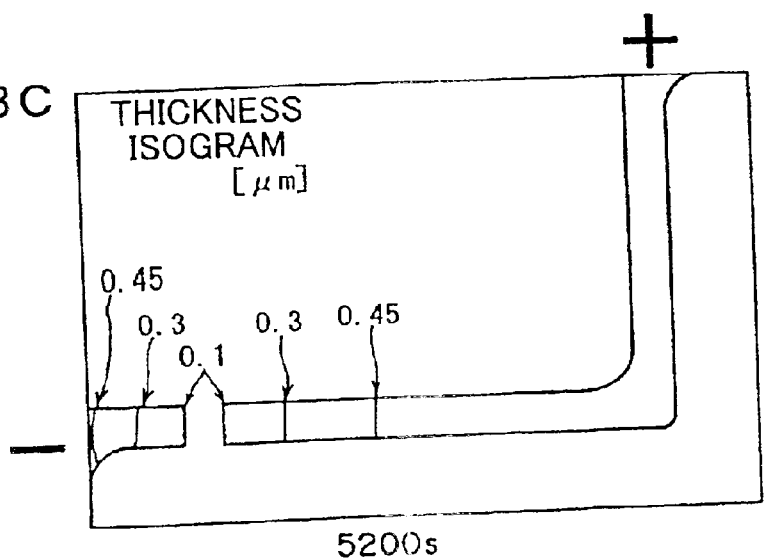

The changes with time in $AFD_{gen}$ distribution and void distribution occurring in the case of ASYM(+) are shown in FIG. 18 and FIG. 19, respectively. In the same manner, those for the case of SYM are shown in FIGS. 20 and 21, respectively, and those for ASYM(−) are shown in FIGS. 22 and 23, respectively. For this, void distribution is shown using isograms of the interconnect thickness. $AFD_{gen}$ distribution changes with time while stressing electric current because of changes in current density and temperature distribution accompanying the growth of voids. For ASYM (+), failure has been estimated to occur in the anode side of the corner of the interconnect after 7100 s from the start of current-applying. In addition, for SYM, failure has been estimated to occur in the anode side of the corner after 7000 s. On the other hand, for ASYM(−), failure has been estimated to occur near the cathode end of the interconnect after 5200 s.

Figure 26:
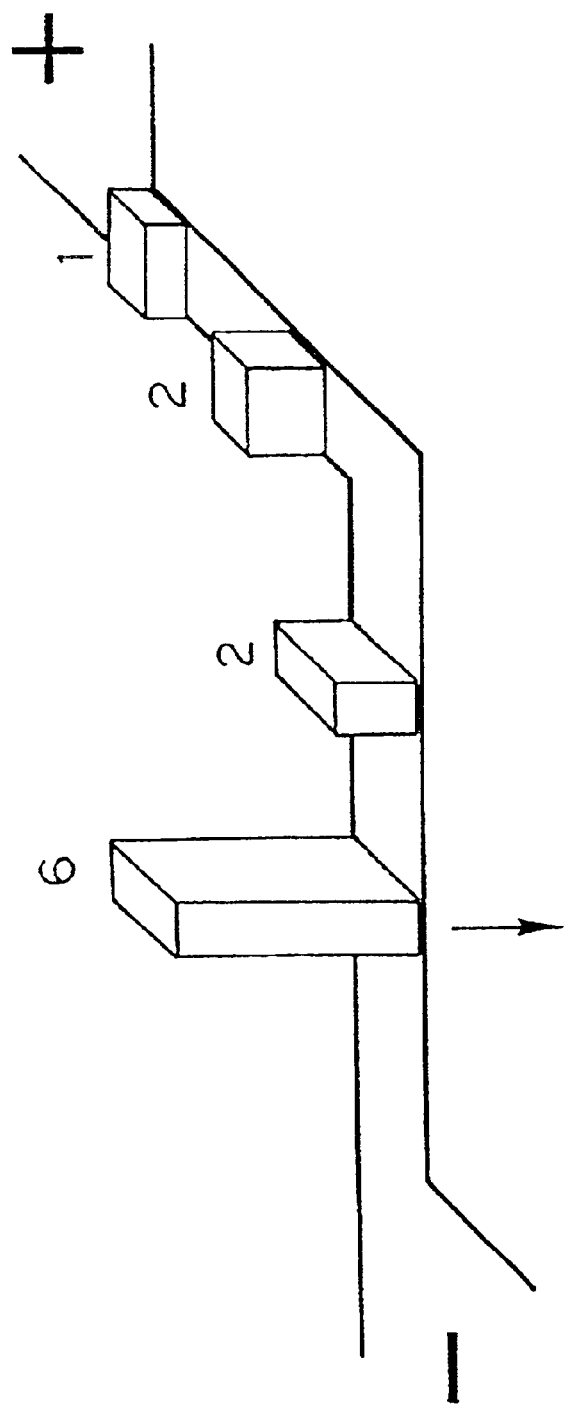
FIG. 26 is a diagram showing the test results in a bamboo interconnect (ASYM(−)).

In order to verify the usefulness of this failure prediction method, testing until failure has been performed with the same conditions and the three types of shapes of interconnects as assumed in the failure estimation. Current stressing has been performed until breakage using the setup shown in FIG. 11. After breakage, observation has been performed with a field emission-type electron microscope (FE-SEM). For this testing, 9 specimens for ASYM(+), 10 specimens for SYM, and 11 specimens for ASYM(−) have been used. For the above testing, the test results for the specimens of ASYM(+), SYM, and ASYM(−) are respectively shown in FIGS. 24 to 26. In the figures, the mean time to failure and failure frequency distribution are shown. In the case of ASYM(+), the mean time to failure of the 9 specimens is 9160 s, and the most frequent site of the failure in the interconnect is the anode side of the corner. The mean time to failure of the 4 specimens that had failed in the anode side of the corner, which had been the failure location estimated by numerical simulation, is 7965 s, which is close to the mean failure time of all 9 specimens. On the other hand, in the case of SYM, the mean time to failure of the 10 specimens is 7836 s and the most frequent failure site is the anode side the corner. The mean failure time of the 5 specimens that had failed in the anode side of the corner, which had been the failure location estimated, is 7344 s, and as with ASYM(+), this is close to the mean time to failure of all 10 specimens. Moreover, in the case of ASYM(−), the mean time to failure of the 11 specimens is 6996 s, and the most frequent failure site is the area near the cathode end of the interconnect. The mean failure time of the 6 specimens that failed at the cathode end of the interconnect, which had been the failure location estimated, is 6160s, which is close to the mean time to failure of all 11 specimens.

CONCLUSION

The estimates and the test results showed favorable agreement for both interconnect lifetime and failure location. The breakage locations during testing were somewhat dispersed; however, with this prediction method, it was possible to estimate the most frequent site of the failure. From this, it was shown that once the material property constants of the thin film constituting the interconnect and the operating conditions are given, then by executing numerical simulation using $AFD_{gen}$, which is the governig parameter for EM damage, it is possible to estimate lifetime and failure location in an arbitrary shape of metal interconnect and under arbitrary conditions of use, and the usefulness of this prediction method is verified.

Void formation induced by electromigration is dependent on current density, temperature, and the gradients thereof in addition to material properties of the material such as electrical resistivity, average grain sizediameter, activation energy, the relative angle between crystal grain boundaries, atomic density, diffusion coefficient, effective charge, and the effective width of the crystal grain boundaries. Parameter $AFD_{gen}$, which is a unction of these factors, governs void formation. Failure of the metal interconnect is mainly a result of void formation and growth. The location of failures changes depending on the combination of these factors, which are decided by interconnect shape or substrate temperature or by operational conditions such as input current density and temperature. In other words, in some cases failures develop in the corners of an angled metal interconnect, and in some cases they occur at the cathode ends of an angled interconnect. Through use of the prediction method of the present invention, the cornerstone of which is $AFD_{gen}$, the lifetime of a metal interconnect and the failure location can be accurately estimated.

The present invention is applicable not only to a stand-alone computer system, but may be applicable to also those formed from a plurality of systems such as a client server system or the like.

The constitution of the present invention may be achieved by the reading and execution of a program by a system from a recording medium stored with a program for performing the estimation related to the present invention. This recording medium may include a floppy disk, CD-ROM, magnetic tape, ROM cassette, or the like.

As described in the above, through use of the prediction method of the present invention, estimation of the lifetime of a metal interconnect and the location of failures can be performed with accuracy.

What is claimed is:

1. A metal interconnect reliability evaluating device comprising:

first means for finding current density and temperature distribution of the metal interconnect using a numerical analysis method;

second means for calculating a parameter for an EM damage of each of elements of the metal interconnect, each of the elements being divided into a predetermined shape, based on the current density, the temperature distribution, a predetermined material property constant of an interconnect material and parameter equation for obtaining reduced number of atoms per unit time and unit volume;

third means for finding reduction in volume of each of the elements; and fourth means for finding a change in thickness of each of the elements;

wherein processing is performed by repeating operation of the first through fourth means until the elements penetrating the thickness and/or elements having a temperature exceeding a melting point of material of the metal interconnect occupy a width of the interconnect, whereby a lifetime and failure location of the interconnect are estimated.

2. The metal interconnect reliability evaluating device according to claim 1, wherein said metal interconnect is a polycrystalline interconnect or a bamboo interconnect.

3. A method for evaluating reliability of a metal interconnect comprising steps of:

(a) finding current density and temperature distribution of the metal interconnect using numerical analysis method;

(b) calculating a governing parameter for EM damage of each of elements, each of the elements being divided into a predetermined shape, using said current density, the temperature distribution, material property constants of an interconnect material and parameter equation for obtaining reduced number of atoms per unit time and unit volume;

(c) finding a reduction in volume of each element in each of calculation steps; and (d) finding a change in thickness of each element;

repeating the steps (a) through (d) the elements penetrating the thickness and/or elements having a temperature exceeding a melting point of material of the metal interconnect occupy a width of the interconnect, whereby a lifetime and failure location of the interconnect are estimated.

4. The method for evaluating reliability of a metal interconnect according to claim 3 wherein said metal interconnect is a polycrystalline interconnect or a bamboo interconnect.

5. A recording medium stored with a program for executing the method for evaluating reliability according to claim 3 in a computer.

6. A recording medium stored with a program for executing the method for evaluating reliability according to claim 4 in a computer.

* * * * *